(12) United States Patent
Kim et al.

(10) Patent No.: US 8,476,631 B2
(45) Date of Patent: Jul. 2, 2013

(54) THIN FILM TRANSISTOR WITH OFFSET STRUCTURE AND ELECTRODES IN A SYMMETRICAL ARRANGEMENT

(75) Inventors: Ki-Hong Kim, Yongin (KR); Jeong-Hwan Kim, Yongin (KR); Yong-Jae Jang, Yongin (KR); Jung-Hyun Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/084,357

(22) Filed: Apr. 11, 2011

(65) Prior Publication Data

US 2011/0297937 A1 Dec. 8, 2011

(30) Foreign Application Priority Data

Jun. 8, 2010 (KR) .................. 10-2010-0053666

(51) Int. Cl.
*H01L 29/786* (2006.01)

(52) U.S. Cl.
USPC .......................................................... 257/57

(58) Field of Classification Search
USPC ........ 257/57, 59, 72, 359, E21.412; 365/174, 365/182, 185
See application file for complete search history.

(56) References Cited

U.S. PATENT DOCUMENTS

| | | | | |
|---|---|---|---|---|
| 5,266,825 A * | 11/1993 | Tsukada et al. | ................ | 257/366 |
| 5,384,731 A * | 1/1995 | Kuriyama et al. | ............ | 365/182 |
| 5,438,540 A | 8/1995 | Kim | | |
| 6,013,930 A | 1/2000 | Yamazaki et al. | | |
| 7,095,171 B2 * | 8/2006 | Park | ................ | 313/506 |
| 7,888,151 B2 * | 2/2011 | Kang et al. | ................ | 438/30 |
| 8,124,975 B2 * | 2/2012 | Noda et al. | ................ | 257/59 |
| 2002/0117689 A1 | 8/2002 | Akimoto | | |
| 2002/0195604 A1 * | 12/2002 | Segawa et al. | ................ | 257/72 |
| 2006/0220023 A1 * | 10/2006 | Hoffman et al. | ................ | 257/72 |
| 2006/0292726 A1 | 12/2006 | Akimoto et al. | | |
| 2010/0109009 A1 | 5/2010 | Noda et al. | | |
| 2010/0163868 A1 * | 7/2010 | Yamazaki et al. | ............ | 257/43 |
| 2010/0258802 A1 * | 10/2010 | Godo et al. | ................ | 257/57 |
| 2010/0276686 A1 * | 11/2010 | Lee et al. | ................ | 257/43 |
| 2010/0320470 A1 * | 12/2010 | You | ................ | 257/59 |
| 2011/0140109 A1 * | 6/2011 | Yamazaki et al. | ............ | 257/57 |

FOREIGN PATENT DOCUMENTS

| | | |
|---|---|---|
| EP | 0 403 279 A1 | 12/1990 |
| JP | 06-188418 | 7/1994 |
| JP | 11-097708 | 4/1999 |
| JP | 2002-261288 | 9/2002 |
| JP | 2006-179878 | 7/2006 |
| JP | 2010-109200 | 5/2010 |
| KR | 1996-0010072 B1 | 7/1996 |
| KR | 10-2000-0041380 A | 7/2000 |
| KR | 10-2000-0041409 A | 7/2000 |

* cited by examiner

OTHER PUBLICATIONS

Japanese Office action dated Dec. 19, 2012, for corresponding Japanese Patent application 2011-086228, (3 pages).

*Primary Examiner* — Nathan Ha

(74) *Attorney, Agent, or Firm* — Christie, Parker & Hale, LLP

(57) ABSTRACT

A thin film transistor (TFT) having an offset structure is disclosed. The TFT maintains a sufficiently low "off" current and a sufficiently high "on" current. The TFT includes an active region. The active region includes a gate electrode; an active layer that overlaps with the gate electrode; a gate insulating layer between the gate electrode and the active layer; and a source/drain electrode layer including source/drain electrodes that are electrically connected to the active region. Some of the source/drain electrodes overlap partially with the gate electrode. Other of the source/drain electrodes are offset from the gate electrode. The source/drain electrodes and the gate electrode are in a symmetrical arrangement.

44 Claims, 15 Drawing Sheets

THIN FILM TRANSISTOR WITH OFFSET STRUCTURE AND ELECTRODES IN A SYMMETRICAL ARRANGEMENT

CROSS-REFERENCE TO RELATED PATENT APPLICATION

This application claims priority to and the benefit of Korean Patent Application No. 10-2010-0053666, filed on Jun. 8, 2010, in the Korean Intellectual Property Office, the entire content of which is incorporated herein by reference.

BACKGROUND

1. Field

Aspects of embodiments according to the present invention relate to a thin film transistor and, more particularly, to a high-voltage thin film transistor with an offset structure.

2. Description of the Related Art

A thin film transistor (TFT) is a special type of a field effect transistor (FET) in which a thin semiconductor film is formed on an insulating supporting substrate. Similar to the FET, the TFT has three terminals, i.e., a gate, a drain, and a source, and performs switching as a main function. By adjusting a voltage that is applied to the gate, the TFT performs switching so that current flowing between the source and the drain may be in an "on" or "off" state.

A conventional high-voltage TFT is a type of TFT to which a high voltage is applied. The conventional high-voltage TFT may employ an offset structure so that it can be more resistant to the high voltage. A conventional offset structure has an offset region, which is a high-resistance region between a source region and a drain region. In general, if a high voltage is applied between the source region and the drain region, then the high voltage is also delivered to the high-resistance offset region, thereby preventing a high electric field from being formed on a channel layer. Accordingly, the TFT may be maintained at a sufficiently low level of "off" current $I_{off}$.

However, since the high-resistance offset region is intentionally employed in the conventional high-voltage TFT in order to reduce bias stress caused when a high voltage is applied, the amount of "on" current $I_{on}$ may eventually decrease.

SUMMARY

In order to solve or lessen the severity of a problem of a conventional high-voltage thin film transistor (TFT) having an offset structure whereby the amount of "on" current $I_{on}$ decreases, one or more embodiments of the present invention provide a thin film transistor in which a low "off" current and a high "on" current $I_{on}$ can be maintained at a sufficiently low level and a sufficiently high level, respectively.

In an exemplary embodiment of the present invention, a thin film transistor (TFT) is disclosed. The TFT includes an active region. The active region is divided into a first active region and a second active region. The active region includes a gate electrode, an active layer, a gate insulating layer, and a source/drain electrode layer. The active layer includes a first active layer and a second active layer. The first active layer corresponds to the first active region. The second active layer corresponds to the second active region. The first active layer and the second active layer overlap with the gate electrode. The gate insulating layer is between the gate electrode and the active layer. The source/drain electrode layer includes a first source/drain electrode, a second source/drain electrode, a third source/drain electrode, and a fourth source/drain electrode. The first and second source/drain electrodes are electrically connected to the first active layer. The third and fourth source/drain electrodes are electrically connected to the second active layer. Two source/drain electrodes selected from among the first to fourth source/drain electrodes overlap partially with the gate electrode. Other two source/drain electrodes from among the first to fourth source/drain electrodes are offset from the gate electrode. The first to fourth source/drain electrodes and the gate electrode are in a symmetrical arrangement.

The first and third source/drain electrodes may be electrically connected to each other so that a same voltage is applied to the first and third source/drain electrodes. The second and fourth source/drain electrodes may be electrically connected to each other so that a same voltage is applied to the second and fourth source/drain electrodes.

The first source/drain electrode and the third source/drain electrode may be connected to each other. The second source/drain electrode and the fourth source/drain electrode may be connected to each other.

The TFT may include two TFTs. Corresponding source/drain and gate electrodes of the two TFTs may be connected in a symmetrical arrangement to function as a single TFT.

The active layer may include a material selected from the group including amorphous silicon, polycrystalline silicon, microcrystalline silicon, an oxide semiconductor, an organic semiconductor, and combinations thereof.

The active region may further include an ohmic contact layer between the active layer and the source/drain electrode layer.

The first active layer may include a first source/drain region, a second source/drain region, and a first channel region. The first source/drain region corresponds to the first source/drain electrode. The second source/drain region corresponds to the second source/drain electrode. The first channel region is between the first source/drain region and the second source/drain region. The second active layer may include a third source/drain region, a fourth source/drain region, and a second channel region. The third source/drain region corresponds to the third source/drain electrode. The fourth source/drain region corresponds to the fourth source/drain electrode. The second channel region is between the third source/drain region and the fourth source/drain region.

The first channel region may include a first offset region. The first offset region does not overlap with any of the gate electrode, the first source/drain electrode, and the second source/drain electrode. The second channel region may include a second offset region. The second offset region does not overlap with any of the gate electrode, the third source/drain electrode, and the fourth source/drain electrode.

The source/drain electrode layer in the second active region may be rotationally symmetrical to the source/drain electrode layer in the first active region.

One of the first source/drain electrode and the second source/drain electrode may overlap with the gate electrode. An other of the first source/drain electrode and the second source/drain electrode may be offset from the gate electrode.

The first active region and the second active region may be insulated from each other.

The gate electrode may include a first gate electrode and a second gate electrode. The first gate electrode and the second gate electrode are parallel with each other.

The first and third source/drain electrodes may be electrically connected to each other so that a same voltage is applied to the first and third source/drain electrodes. The second and fourth source/drain electrodes may be electrically connected to each other so that a same voltage is applied to the second and fourth source/drain electrodes.

The source/drain electrode layer in the second active region may be rotationally symmetrical to the source/drain electrode layer in the first active region.

One of the first to fourth source/drain electrodes may overlap partially with the first gate electrode. An other of the first to fourth source/drain electrodes may overlap partially with the second gate electrode.

A width of the first gate electrode that overlaps with the second active layer may be smaller than a width of the first gate electrode that overlaps with the first active region.

The active region may further include an offset electrode. The offset electrode overlaps with a region between the first gate electrode and the second gate electrode. The offset electrode is insulated from the active layer.

The offset electrode may include a first offset electrode and a second offset electrode. The first offset electrode overlaps with a region between the first and second source/drain electrodes. The first offset electrode is insulated from the first active layer. The second offset electrode overlaps with a region between the third and fourth source/drain electrodes. The second offset electrode is insulated from the second active layer.

The first and third source/drain electrodes may be electrically connected to each other so that a same voltage is applied to the first and third source/drain electrodes. The second and fourth source/drain electrodes may be electrically connected to each other so that a same voltage is applied to the second and fourth source/drain electrodes.

The offset electrode may be electrically connected to the first gate electrode and the second gate electrode.

The first active region and the second active region may be insulated from each other.

In another exemplary embodiment according to the present invention, a thin film transistor (TFT) is disclosed. The TFT includes an active region. The active region is divided into a first active region, a second active region, and a third active region. The active region includes a gate electrode, an active layer, a gate insulating layer, and a source/drain electrode layer. The active layer includes a first active layer, a second active layer, and a third active layer. The first active layer corresponds to the first active region. The second active layer corresponds to the second active region. The third active layer corresponds to the third active region. The first active layer, the second active layer, and the third active layer overlap with the gate electrode. The gate insulating layer is between the gate electrode and the active layer. The source/drain electrode layer includes a first source/drain electrode, a second source/drain electrode, a third source/drain electrode, a fourth source/drain electrode, a fifth source/drain electrode, and a sixth source/drain electrode. The first source/drain electrode and the second source/drain electrode are electrically connected to the first active layer. The third source/drain electrode and the fourth source/drain electrode are electrically connected to the second active layer. The fifth source/drain electrode and the sixth source/drain electrode are electrically connected to the third active layer. Two source/drain electrodes selected from among the first to fourth source/drain electrodes overlap partially with the gate electrode. Other two source/drain electrodes from among the first to fourth source/drain electrodes are offset from the gate electrode. The first to sixth source/drain electrodes and the gate electrode are in a symmetrical arrangement.

The first, third, and fifth source/drain electrodes may be electrically connected to each other so that a same voltage is applied to the first, third, and fifth source/drain electrodes.

The second, fourth, and sixth source/drain electrodes may be electrically connected to each other so that a same voltage is applied to the second, fourth, and sixth source/drain electrodes.

The source/drain electrode layer in the third active region may be symmetrical to the source/drain electrode layer in the first active region.

The first source/drain electrode and the second source/drain electrode may overlap partially with the gate electrode. The third source/drain electrode and the fourth source/drain electrode may be offset from the gate electrode.

The first active layer may include a first source/drain region, a second source/drain region, and a first channel region. The first source/drain region corresponds to the first source/drain electrode. The second source/drain region corresponds to the second source/drain electrode. The first channel region is between the first source/drain region and the second source/drain region. The second active layer may include a third source/drain region, a fourth source/drain region, and a second channel region. The third source/drain region corresponds to the third source/drain electrode. The fourth source/drain region corresponds to the fourth source/drain electrode. The second channel region is between the third source/drain region and the fourth source/drain region. The third active layer may include a fifth source/drain region, a sixth source/drain region, and a third channel region. The fifth source/drain region corresponds to the fifth source/drain electrode. The sixth source/drain region corresponds to the sixth source/drain electrode. The third channel region is between the fifth source/drain region and the sixth source/drain region.

The second channel region may include an offset region. The offset region does not overlap with any of the gate electrode, the third source/drain electrode, and the fourth source/drain electrode.

The source/drain electrode layer in the first active region, the source/drain electrode layer in the second active region, and the source/drain electrode layer in the third active region may be symmetrical along an axis of symmetry.

A width of the gate electrode that overlaps with the second active layer may be smaller than a width of the gate electrode that overlaps with the first and third active regions.

The first to third active regions may be insulated from one another.

In yet another exemplary embodiment according to the present invention, a thin film transistor (TFT) is disclosed. The TFT includes an active region. The active region is divided into a first active region, a second active region, a third active region, and a fourth active region. The active region includes a gate electrode, an active layer, a gate insulating layer, and a source/drain electrode layer. The active layer includes a first active layer, a second active layer, a third active layer, and a fourth active layer. The first active layer corresponds to the first active region. The second active layer corresponds to the second active region. The third active layer corresponds to the third active region. The fourth active layer corresponds to the fourth active region. The first active layer, the second active layer, the third active layer, and the fourth active layer overlap with the gate electrode. The gate insulating layer is between the gate electrode and the active layer. The source/drain electrode layer includes a first source/drain electrode, a second source/drain electrode, a third source/drain electrode, a fourth source/drain electrode, a fifth source/drain electrode, a sixth source/drain electrode, a seventh source/drain electrode, and an eighth source/drain electrode. The first source/drain electrode and the second source/drain electrode are electrically connected to the first active layer.

The third source/drain electrode and the fourth source/drain electrode are electrically connected to the second active layer. The fifth source/drain electrode and the sixth source/drain electrode are electrically connected to the third active layer. The seventh source/drain electrode and the eighth source/drain electrode are electrically connected to the fourth active layer. Two source/drain electrodes selected from among the third to sixth source/drain electrodes overlap partially with the gate electrode. Other two source/drain electrodes from among the third to sixth source/drain electrodes are offset from the gate electrode. The first to eighth source/drain electrodes and the gate electrode are in a symmetrical arrangement.

The first, third, fifth, and seventh source/drain electrodes may be electrically connected to each other so that a same voltage is applied to the first, third, fifth, and seventh source/drain electrodes. The second, fourth, sixth, and eighth source/drain electrodes may be electrically connected to each other so that a same voltage is applied to the second, fourth, sixth, and eighth source/drain electrodes.

The first active layer may include a first source/drain region, a second source/drain region, and a first channel region. The first source/drain region corresponds to the first source/drain electrode. The second source/drain region corresponds to the second source/drain electrode. The first channel region is between the first source/drain region and the second source/drain region. The second active layer may include a third source/drain region, a fourth source/drain region, and a second channel region. The third source/drain region corresponds to the third source/drain electrode. The fourth source/drain region corresponds to the fourth source/drain electrode. The second channel region is between the third source/drain region and the fourth source/drain region. The third active layer may include a fifth source/drain region, a sixth source/drain region, and a third channel region. The fifth source/drain region corresponds to the fifth source/drain electrode. The sixth source/drain region corresponds to the sixth source/drain electrode. The third channel region is between the fifth source/drain region and the sixth source/drain region. The fourth active layer may include a seventh source/drain region, an eighth source/drain region, and a fourth channel region. The seventh source/drain region corresponds to the seventh source/drain electrode. The eighth source/drain region corresponds to the eighth source/drain electrode. The fourth channel region is between the seventh source/drain region and the eighth source/drain region.

The second channel region may include a first offset region. The first offset region does not overlap with any of the gate electrode, the third source/drain electrode, and the fourth source/drain electrode. The third channel region may include a second offset region. The second offset region does not overlap with any of the gate electrode, the fifth source/drain electrode, and the sixth source/drain electrode.

The source/drain electrode layer in the third active region may be rotationally symmetrical to the source/drain electrode layer in the second active region. The source/drain electrode layer in the fourth active region may be symmetrical to the source/drain electrode layer in the first active region.

The first source/drain electrode and the second source/drain electrode may overlap partially with the gate electrode.

One of the third source/drain electrode and the fourth source/drain electrode may overlap with the gate electrode. An other of the third source/drain electrode and the fourth source/drain electrode may be offset from the gate electrode.

A width of the gate electrode that overlaps with the second and third active regions may be smaller than a width of the gate electrode that overlaps with the first and fourth active regions.

The first to fourth active regions may be insulated from one another.

In still yet another exemplary embodiment according to the present invention, a thin film transistor (TFT) is disclosed. The TFT includes an active region. The active region includes a gate electrode, an active layer, a gate insulating layer, and a source/drain electrode layer. The gate electrode includes a first gate electrode and a second gate electrode. The first gate electrode and the second gate electrode are parallel with each other. The active layer overlaps with the first gate electrode and the second gate electrode. The gate insulating layer is between the gate electrode and the active layer. The source/drain electrode layer includes a first source/drain electrode and a second source/drain electrode. The first source/drain electrode and the second source/drain electrode are electrically connected to the active layer. The first source/drain electrode overlaps partially with the first gate electrode. The second source/drain electrode overlaps partially with the second gate electrode. The first and second source/drain electrodes and the gate electrode are in a symmetrical arrangement.

The active region may further include an offset electrode. The offset electrode overlaps with a region between the first gate electrode and the second gate electrode. The offset electrode is insulated from the active layer.

The offset electrode may be electrically connected to the first gate electrode and the second gate electrode.

The active layer may include a first source/drain region, a second source/drain region, and a channel region. The first source/drain region corresponds to the first source/drain electrode. The second source/drain region corresponds to the second source/drain electrode. The channel region is between the first source/drain region and the second source/drain region.

The channel region may include an offset region. The offset region does not overlap with any of the first gate electrode, the second gate electrode, the first source/drain electrode, and the second source/drain electrode.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1A:
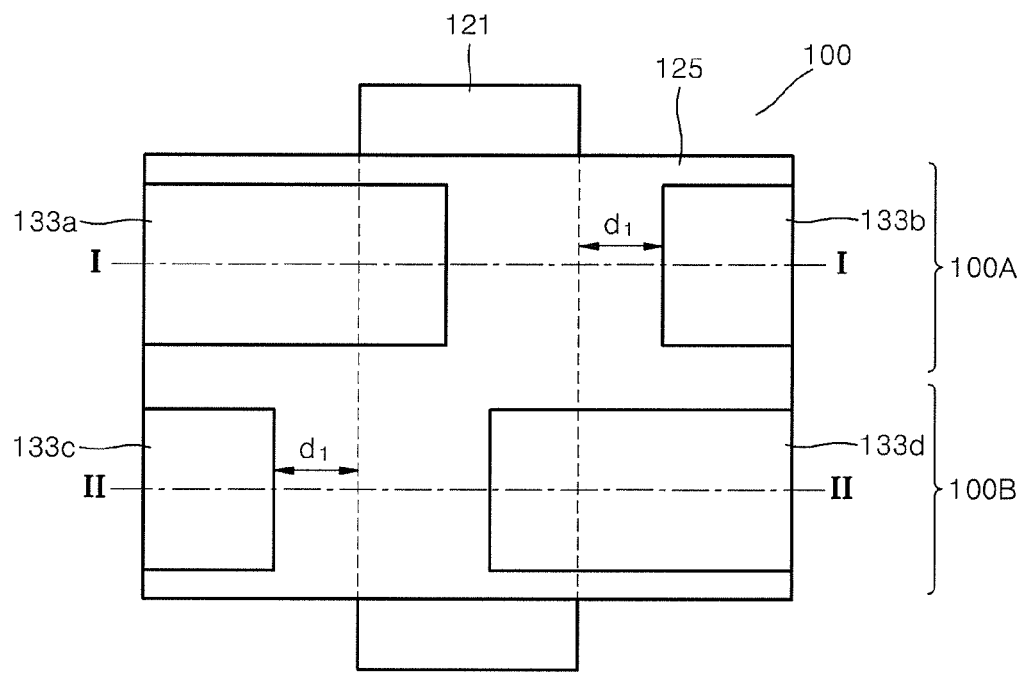
FIG. 1A is a layout diagram illustrating an active region for a thin film transistor (TFT) with an offset structure according to an embodiment of the present invention.

Hereinafter, exemplary embodiments of the present invention will be described in detail with reference to the accompanying drawings. This invention may, however, be embodied in many different forms and should not be construed as being limited to the embodiments set forth herein. Rather, these embodiments are provided so that this disclosure will more thoroughly and completely convey features and aspects of the invention to those of ordinary skill in the art. In the drawings, the thickness of layers and regions may be exaggerated for clarity. In addition, like reference numerals represent like elements throughout the drawings.

In this disclosure, a source electrode and a drain electrode are not differentiated from each other and are described simply as source/drain electrodes. This is because in many situations (for example, in a display device), any one of the source/drain electrodes may act as either a source electrode or a drain electrode according to a voltage applied to a corresponding thin film transistor (TFT).

In this disclosure, the term "offset region" denotes a channel region in which source/drain electrodes and a gate electrode are separated from one another in a horizontal direction (e.g., a direction parallel to an underlying substrate). For example, the offset region may be a channel region between the gate electrode and one of the source/drain electrodes in the horizontal direction. Thus, a resistance value of the offset region is not reduced directly by a gate voltage and is instead maintained at a higher level than that of the channel region excluding the offset region (For example, the channel region that coincides with the gate electrode, but not with a source/drain electrode).

In addition, the term "overlapping region" denotes a source/drain region in which a source/drain electrode and a gate electrode overlap with one another (e.g., coincide in a direction normal to an underlying substrate). Finally, a source/drain electrode will be said to "overlap partially" with a gate electrode when a corresponding active layer contains both an overlapping region (e.g., gate electrode and source/drain electrode coinciding) and a channel region (e.g., gate electrode, but no source/drain electrode coinciding).

Figure 1B:
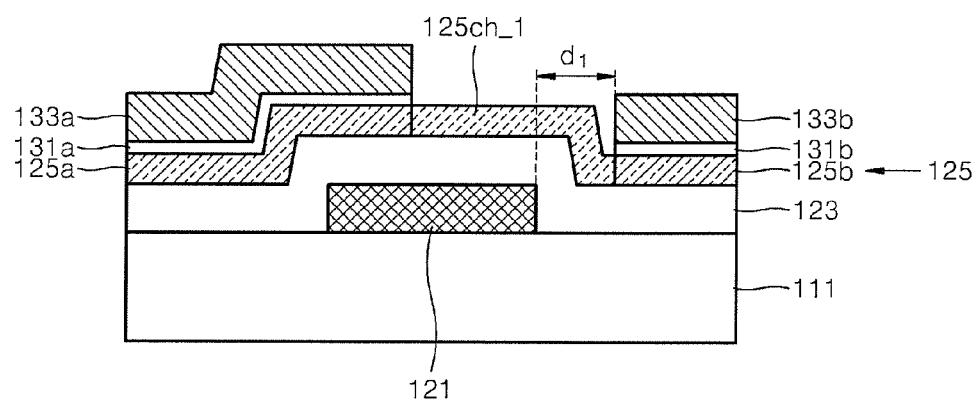
FIG. 1B is a cross-sectional view taken along a line I-I of FIG. 1A.
Figure 1C:
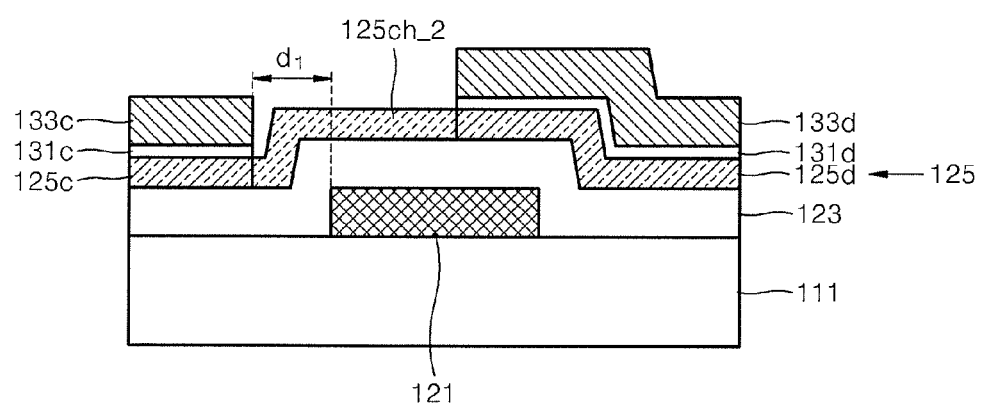
FIG. 1C is a cross-sectional view taken along a line II-II of FIG. 1A.

FIG. 1A is a layout diagram illustrating an active region 100 for a TFT with an offset structure according to an embodiment of the present invention. FIG. 1B is a cross-sectional view taken along a line I-I of FIG. 1A. FIG. 1C is a cross-sectional view taken along a line II-II of FIG. 1A.

Referring to FIGS. 1A to 1C, the active region 100 for the TFT has a vertical stacked structure in which a gate electrode 121 is formed on a substrate 111 and a gate insulating layer 123 is formed on the gate electrode 121 and the substrate 111. An active layer 125 is formed on the gate insulating layer 123, and first and second source/drain electrodes 133a and 133b are formed on the active layer 125. Ohmic contact layers 131a and 131b are formed between the active layer 125 and the first and second source/drain electrodes 133a and 133b, respectively.

The substrate 111 may be formed of, for example, glass, quartz, plastic, silicon, ceramic, or metal. The gate electrode 121 may be formed of, but is not limited to, a conductive material selected from the group including Au, Ag, Cu, Ni, Pt, Pd, Al, Mo, W, Ti, and an alloy thereof. The gate insulating layer 123 may be formed of an insulating layer, such as a silicon oxide layer or a silicon nitride layer. The active layer 125 may be formed of, for example, amorphous silicon, polycrystalline silicon, microcrystalline silicon, an oxide semiconductor, an organic semiconductor, or combinations thereof. The first and second source/drain electrodes 133a and 133b may also be formed of, but are not limited to, a conductive material selected from the group including Au, Ag, Cu, Ni, Pt, Pd, Al, Mo, W, Ti, and an alloy thereof. An ohmic contact between each of the first and second source/drain electrodes 133a and 133b and the active layer 125 is formed using the ohmic contact layers 131a and 131b. The ohmic contact layers 131a and 131b may be, for example, high-density doped amorphous silicon layers.

As illustrated in FIG. 1A, the active region 100 is divided into a first active region 100A and a second active region 100B that are rotationally symmetrical to each other about a center of the active region 100 (e.g., rotating the active region 100 for half a revolution (180°) about its center results in the same layout). In the first active region 100A, the first source/drain electrode 133a overlaps partially with the gate electrode 121, and the second source/drain electrode 133b is separated from the gate electrode 121 by a distance $d_1$ in the horizontal direction (e.g., parallel to the substrate 111), as illustrated in FIG. 1B.

In the first active region 100A, the active layer 125 includes a first source/drain region 125a under the first source/drain electrode 133a, a second source/drain region 125b under the second source/drain electrode 133b, and a first channel region 125ch_1 between the first and second source/drain regions. The first channel region 125ch_1 includes an offset region (corresponding to that portion of the first channel region 125ch_1 marked off by the distance $d_1$ in FIG. 1B, as well as to the area between the gate electrode 121 and the second source/drain electrode 133b marked off by the distance $d_1$ in FIG. 1A) between the gate electrode 121 and the second source/drain electrode 133b.

As illustrated in FIG. 1C, in the second active region 100B, a third source/drain electrode 133c is separated from the gate electrode 121 by the distance $d_1$, and a fourth source/drain electrode 133d overlaps partially with the gate electrode 121. In the second active region 100B, the active layer 125 includes a third source/drain region 125c under the third source/drain electrode 133c, a fourth source/drain region 125d under the fourth source/drain electrode 133d, and a second channel region 125ch_2 between the third and fourth source/drain regions 125c and 125d. The second channel region 125ch_2 includes an offset region (corresponding to that portion of the second channel region 125ch_2 marked off by the distance $d_1$ in FIG. 1C, as well as to the area between the third source/drain electrode 133c and the gate electrode 121 marked off by the distance $d_1$ in FIG. 1A) between the third source/drain electrode 133c and the gate electrode 121.

The layout of the first source/drain electrode 133a and the second source/drain electrode 133b in the first active region 100A is rotationally symmetrical to that of the third source/drain electrode 133c and the fourth source/drain electrode 133d in the second active region 100B. The same rotational symmetry is also exhibited when the gate electrode 121 is considered, which accounts for the similar size in the offset regions and the overlapping regions of the first and second active regions 100A and 100B, as described further below. Ohmic contact layers 131c and 131d are formed between the active layer 125 and the third and fourth source/drain electrodes 133c and 133d, respectively.

The first source/drain electrode 133a in the first active region 100A is electrically connected to the third source/drain electrode 133c in the second active region 100B. Thus, the same voltage is applied from the same source to the first source/drain electrode 133a and the third source/drain electrode 133c. Likewise, the second source/drain electrode 133b in the first active region 100A is electrically connected to the fourth source/drain electrode 133d in the second active region 100B. Thus, the same voltage is applied from the same source to the second source/drain electrode 133b and the fourth source/drain electrode 133d.

In the first active region 100A, if a high voltage is applied to the second source/drain electrode 133b, then current flows from the first source/drain region 125a to the first channel region 125ch_1 and then to the second source/drain region 125b. In this case, the offset region of the first channel region 125ch_1 prevents a high electric field from being applied to the first channel region 125ch_1. Accordingly, it may be possible to prevent the performance of the TFT from degrading, thereby improving the "off" current characteristics thereof. In addition, the first source/drain region 125a overlaps with the gate electrode 121, thus improving the "on" current characteristics thereof.

If a direction in which the high voltage is applied is changed (for example, the high voltage is applied to the first source/drain electrode 133a in the first active region 100A), then current flows from the second source/drain region 125b to the first channel region 125ch_1 and then to the first source/drain region 125a. In this case, a relative position of the offset region with respect to the source/drain region 125a to which the high voltage is applied is different than when the high voltage is applied to the second source/drain electrode 133b, since the offset region is adjacent to the second source/drain region 125b but not to the first source/drain region 125a.

Thus, the intensity of an electric field formed in the first channel region 125ch_1 and the amounts of "on" current and "off" current are also different than when the high voltage is applied to the second source/drain electrode 133b.

That is, if only the first active region 100A is considered, the relative position of the offset region in the first channel region 125ch_1 with respect to the source/drain electrodes to which the high voltages are applied is different. In other words, when the high voltage is applied to the first source/drain electrode 133a, the relative position of the offset region in the first channel region 125ch_1 is different than when the same voltage is applied to the second source/drain electrode 133b. As a result, the intensity of an electric field applied to the first channel region 125ch_1 when the high voltage is applied to the first source/drain electrode 133a is different than when the same voltage is applied to the second source/drain electrode 133b. Thus, the amount of current flowing through the first channel region 125ch_1 is not the same when the same voltage is applied to the first and second source/drain electrodes 133a and 133b, respectively. That is, the amount of current varies according to a direction in which the same voltage is applied. This may lead to an incorrect operation in the device employing the TFT. For example, if such a TFT is part of a display device, an error in gradation expression may occur, thus causing a display error.

On the other hand, when the active region 100 that includes the first active region 100A and the second active region 100B is considered, the layout of the second active region 100B is rotationally symmetrical to that of the first active region 100A. Thus, if a high voltage is applied to the second source/drain electrode 133b in the first active region 100A, the amount of current flowing through the first active region 100A is equal to (or substantially equal to) the amount of current flowing through the second active region 100B when the high voltage is applied to the third source/drain electrode 133c in the second active region 100B. Likewise, the amount of current flowing through the first active region 100A when the high voltage is applied to the first source/drain electrode 133a in the first active region 100A is equal to (or substantially equal to) the amount of current flowing through the second active region 100B when the high voltage is applied to the fourth source/drain electrode 133d in the second active region 100B.

Thus, the total amount of current flowing through the active region 100 when the high voltage is applied to the second source/drain electrode 133b in the first active region 100A and the fourth source/drain electrode 133d in the second active region 100B is substantially the same as when the same voltage is applied to the first source/drain electrode 133a in the first active region 100A and the third source/drain electrode 133c in the second active region 100B. That is, if a direction of the same voltage is changed, a direction of current changes, but the total amount of current flowing through the active region 100 is substantially the same.

In other embodiments, the first active region 100A and the second active region 100B may be insulated from each other so that each of them may not be influenced by current flowing through the other. The first active region 100A and the second active region 100B may be insulated from each other, for example, by applying an insulating layer to the active layer 125. The shapes of the first active region 100A and the second active region 100B may vary according to the shape of the insulating layer applied to the active layer 125.

In another embodiment, in the active region 100, the first source/drain electrode 133a may be connected to the third source/drain electrode 133c and the second source/drain electrode 133b may be connected to the fourth source/drain electrode 133d. In this case, it is also possible to maintain an offset region, an overlapping region, and symmetry (for example, rotational symmetry) between the first active region 100A and the second active region 100B. In yet another embodiment, the first source/drain electrode 133a may be connected to the third source/drain electrode 133c and the second source/drain electrode 133b may be connected to the fourth source/drain electrode 133d within the active region 100 while the first active region 100A is insulated from the second active region 100B.

Figure 2A:
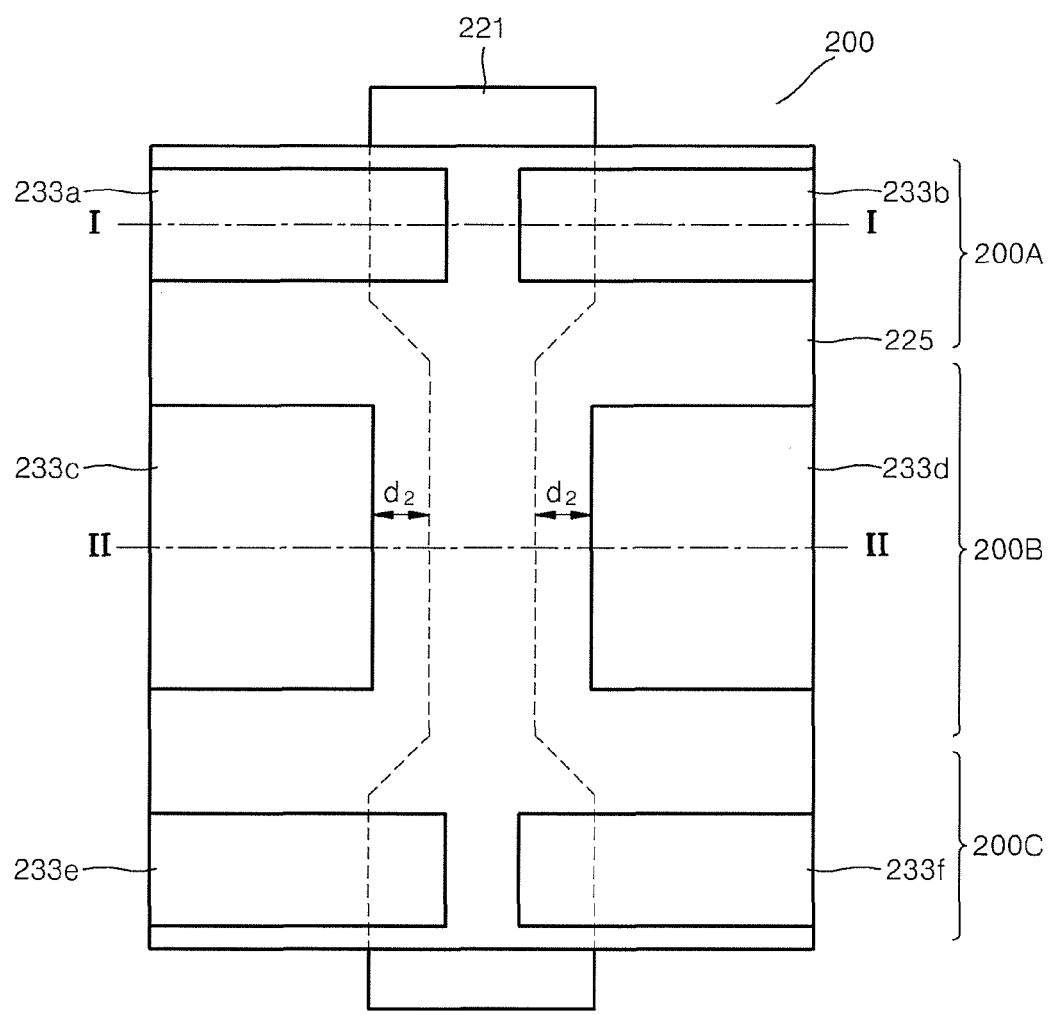
FIG. 2A is a layout diagram illustrating an active region for a TFT with an offset structure according to another embodiment of the present invention.
Figure 2B:
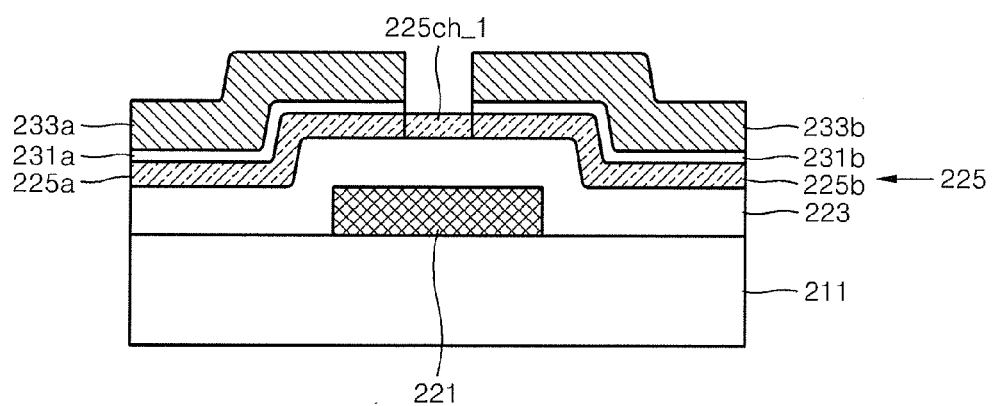
FIG. 2B is a cross-sectional view taken along a line I-I of FIG. 2A.
Figure 2C:
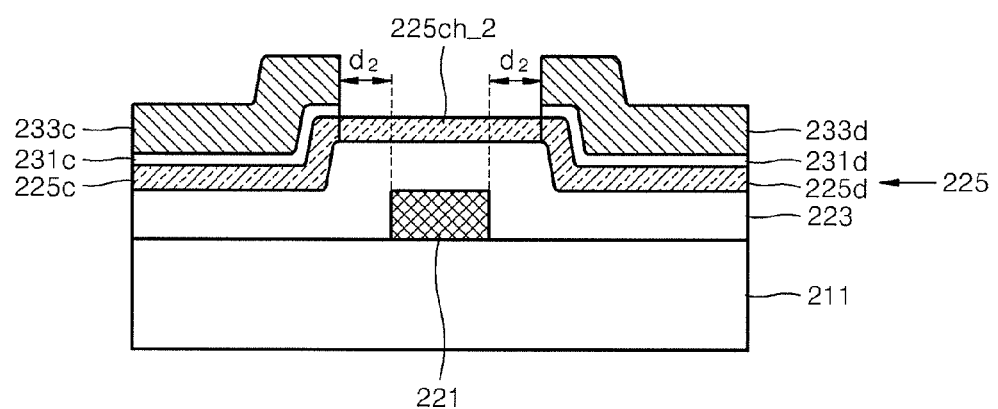
FIG. 2C is a cross-sectional view taken along a line II-II of FIG. 2A.

FIG. 2A is a layout diagram illustrating an active region 200 for a TFT with an offset structure according to another embodiment of the present invention. FIG. 2B is a cross-sectional view taken along a line I-I of FIG. 2A. FIG. 2C is a cross-sectional view taken along a line II-II of FIG. 2A. A vertical stacked structure of the TFT according to the current embodiment is similar to that of the TFT described above with reference to FIGS. 1A to 1C and thus, will not be described again here. Likewise, with FIGS. 2A-2C and the following figures, for conciseness of description, elements whose reference numerals differ only in the leading digit and whose structure is substantially the same as those described in earlier embodiments may not have such descriptions repeated.

As illustrated in FIG. 2A, the active region 200 is divided into a first active region 200A, a second active region 200B, and a third active region 200C. The layout of the first active region 200A is substantially the same as that of the third active region 200C. In addition, the layout of each of the first active region 200A, the second active region 200B, and the third active region 200C is symmetrical along a vertical axis of symmetry (e.g., the line perpendicular to the line II-II and bisecting the gate electrode 221 in FIG. 2A). This type of symmetry is also referred to as "reflection symmetry" or "reflectional symmetry." The layout of each of the first active region 200A, the second active region 200B, and the third active region 200C is also symmetrical along a horizontal axis of symmetry (e.g., the line II-II in FIG. 2A). Further, the layout of each of the first active region 200A, the second active region 200B, and the third active region 200C is rotationally symmetrical about a center of the active region 200. The width of the portions of a gate electrode 221 that overlap with the second active region 200B may be smaller than the width of the portions of the gate electrode 221 that overlap with the first and third active regions 200A and 200C (as illustrated with dashed lines in FIG. 2A).

As illustrated in FIG. 2B, in the first active region 200A, a first source/drain electrode 233a and a second source/drain electrode 233b are symmetrical with respect to the gate electrode 221 while overlapping partially with the gate electrode 221. In the first active region 200A, an active layer 225 includes a first source/drain region 225a under the first source/drain electrode 233a, a second source/drain region 225b under the second source/drain electrode 233b, and a first channel region 225ch_1 between the first and second source/drain regions 225a and 225b.

As illustrated in FIG. 2C, in the second active region 200B, each of a third source/drain electrode 233c and a fourth source/drain electrode 233d is symmetrical with respect to the gate electrode 221, and is separated from the gate electrode 221 by a distance $d_2$. In the second active region 200B, the active layer 225 includes a third source/drain region 225c under the third source/drain electrode 233c, a fourth source/drain region 225d under the fourth source/drain electrode 233d, and a second channel region 225ch_2 between the third and fourth source/drain regions 225c and 225d. The second channel region 225ch_2 also includes an offset region between the third source/drain electrode 233c and the gate electrode 221, and an offset region between the gate electrode 221 and the fourth source/drain electrode 233d (corresponding to respective portions of the second channel region 225ch_2 marked off by the distance $d_2$ in FIG. 2C, as well as to the areas between the gate electrode 221 and the third and fourth source/drain electrodes 233c and 233d marked off by the distance $d_2$ in FIG. 2A).

As illustrated in FIG. 2A, in the third active region 200C, a fifth source/drain electrode 233e and a sixth source/drain electrode 233f are symmetrical with respect to the gate electrode 221 while overlapping partially with the gate electrode 221. The layout of the fifth and sixth source/drain electrodes 233e and 233f in the third active region 200C is substantially the same as that of the first and second source/drain electrodes 233a and 233b in the first active region 200A. Thus, similar to the structure of the first active region 200A shown in FIG. 2B, in the third active region 200C, the active layer 225 includes a fifth source/drain region 225e under the fifth source/drain electrode 233e, a sixth source/drain region 225f under the sixth source/drain electrode 233f, and a third channel region 225ch_3 between the fifth and sixth source/drain regions 225e and 225f.

The first source/drain electrode 233a in the first active region 200A, the third source/drain electrode 233c in the second active region 200B, and the fifth source/drain electrode 233e in the third active region 200C are electrically connected to one another. Thus, the same voltage is applied from the same source to the first, third, and fifth source/drain electrodes 233a, 233c, and 233e. Likewise, the second source/drain electrode 233b in the first active region 200A, the fourth source/drain electrode 233d in the second active region 200B, and the sixth source/drain electrode 233f in the third active region 200C are electrically connected to one another. Thus, the same voltage is applied from the same source to the second, fourth, and sixth source/drain electrodes 233b, 233d, and 233f.

In the first active region 200A, the first source/drain electrode 233a and the second source/drain electrode 233b are symmetrical with respect to the gate electrode 221. In the second active region 200B, the third source/drain electrode 233c and the fourth source/drain electrode 233d are symmetrical with respect to the gate electrode 221. In the third active region 200C, the fifth source/drain electrode 233e and the sixth source/drain electrode 233f are symmetrical with respect to the gate electrode 221. Accordingly, even if a voltage applied to the first, third and fifth electrodes and a voltage applied to the second, fourth and sixth electrodes are interchanged, the total amount of current flowing through the active region 200 may be maintained at a constant level in the opposite direction.

In this case, in the first active region 200A and the third active region 200C, the source/drain regions 225a, 225b, 225e, and 225f overlap with both ends of the gate electrode 221, thereby increasing the amount of "on" current. In the second active region 200B, offset regions (corresponding to the areas between the gate electrode 221 and the third and fourth source/drain electrodes 233c and 233d marked off by the distance $d_2$ in FIGS. 2A and 2C) are present in the second channel region 225ch_2 since the third and fourth source/drain electrodes 233c and 233d are each separated from the gate electrode 221 by the distance $d_2$. Thus, a high electric field may be prevented from being applied to the second channel region 225ch_2 when a voltage is applied to the second active region 200B. Accordingly, when the active region 200 is considered, it may be possible to improve the "off" current characteristics by preventing the performance of the TFT from degrading.

The first active region 200A, the second active region 200B, and the third active region 200C are symmetrical with respect to the gate electrode 221. Thus, if a direction of the same voltage is changed, a direction of current changes, but the total amount of current flowing through the active region 200 is substantially the same. Accordingly, according to the layout of the first to third active regions 200A to 200C, the total amount of current flowing through the active region 200 in the TFT according to the current embodiment may be the same when the same voltage is applied regardless of a direction in which the voltage is applied, thereby improving the "off" current characteristics and the "on" current characteristics.

In other embodiments, the first to third active regions 200A to 200C may be insulated from one another so that each of them may not be influenced by current flowing through the others. The first to third active regions 200A to 200C may be insulated from one another, for example, by applying an insulating layer to the active layer 225. The shapes of the first to third active regions 200A to 200C may vary according to the shape of the insulating layer applied to the active layer 225.

In another embodiment, in the active region 200, the first source/drain electrode 233a, the third source/drain electrode 233c, and the fifth source/drain electrode 233e may be connected to one another, and the second source/drain electrode 233b, the fourth source/drain electrode 233d, and the sixth source/drain electrode 233f may be connected to one another. In this case, it is also possible to maintain an offset region, an overlapping region, and symmetry (e.g., reflectional symmetry, rotational symmetry) among the first to third regions 200A to 200C, and the total amount of current flowing through the active region 200 may thus be maintained. In yet another embodiment, the first source/drain electrode 233a, the third source/drain electrode 233c, and the fifth source/drain electrode 233e may be connected to one another, and the second source/drain electrode 233b, the fourth source/drain electrode 233d, and the sixth source/drain electrode 233f may be connected to one another within the active region 200 while the first active region 200A, the second active region 200B, and the third active region 200C are insulated from one another.

Figure 3A:
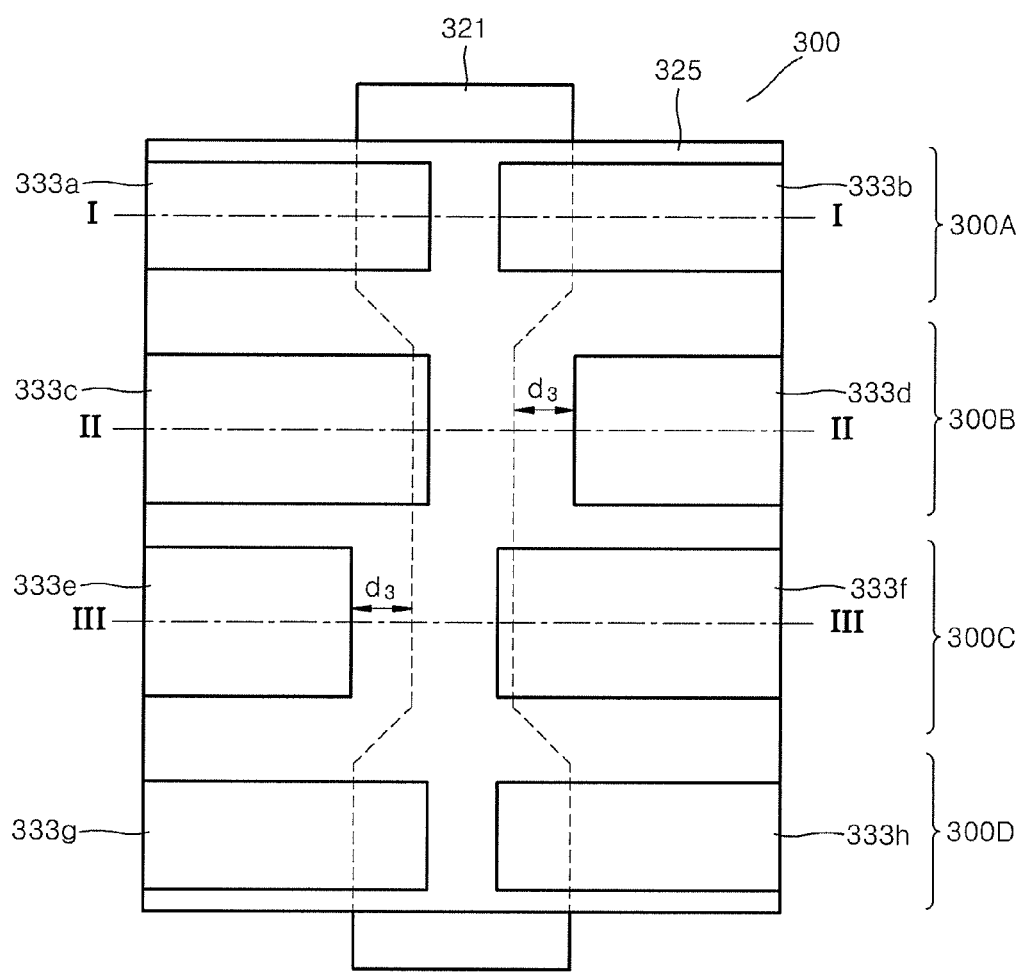
FIG. 3A is a layout diagram illustrating an active region for a TFT with an offset structure according to another embodiment of the present invention.
Figure 3B:
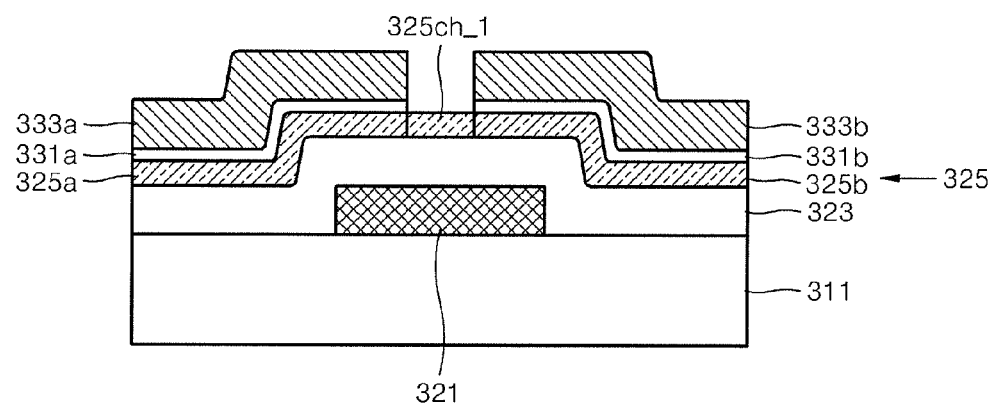
FIG. 3B is a cross-sectional view taken along a line I-I of FIG. 3A.
Figure 3C:
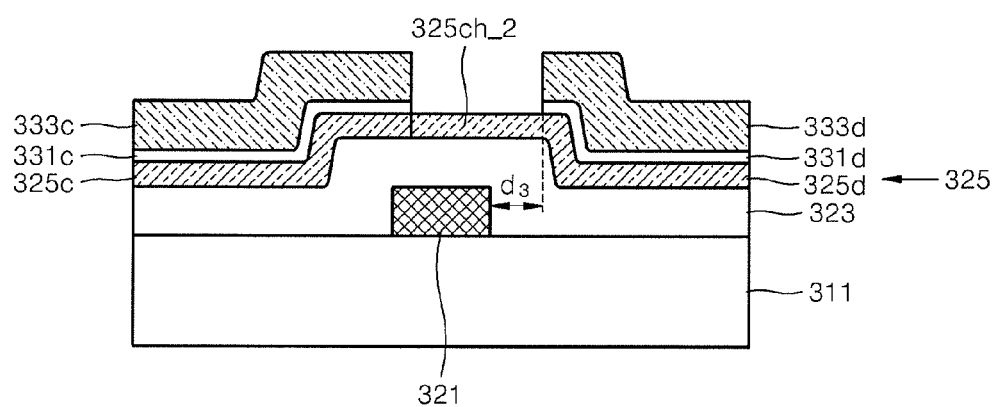
FIG. 3C is a cross-sectional view taken along a line II-II of FIG. 3A.
Figure 3D:
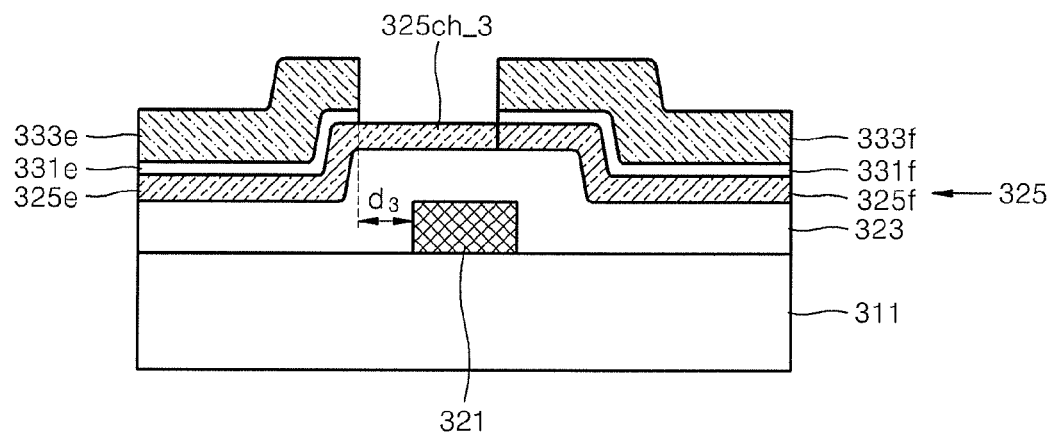
FIG. 3D is a cross-sectional view taken along a line III-III of FIG. 3A.

FIG. 3A is a layout diagram illustrating an active region 300 for a TFT with an offset structure according to another embodiment of the present invention. FIG. 3B is a cross-sectional view taken along a line I-I of FIG. 3A. FIG. 3C is a cross-sectional view taken along a line II-II of FIG. 3A. FIG. 3D is a cross-sectional view taken along a line III-III of FIG. 3A. A vertical stacked structure of the TFT according to the current embodiment is similar to that of the TFT described above with reference to FIGS. 1A to 1C and thus, will not be described again here.

As illustrated in FIG. 3A, the active region 300 is divided into a first active region 300A, a second active region 300B, a third active region 300C, and a fourth active region 300D. The first active region 300A and the fourth active region 300D are substantially the same in terms of their layout and are symmetrical along a vertical axis of symmetry (for example, the line perpendicular to the line I-I and bisecting the gate electrode 321 in FIG. 3A), along a horizontal axis of symmetry (for example, the line separating the second active region 300B from the third active region 300C), and about the center of the active region 300 (that is, rotational symmetry). The layout of the second active region 300B is rotationally symmetrical to that of the third active region 300C. The width of the portions of a gate electrode 321 that overlap with the second and third active regions 300B and 300C may be smaller than the width of the portions of the gate electrode 321 that overlap with the first and fourth active regions 300A and 300D (as illustrated with dashed lines in FIG. 3A).

As illustrated in FIG. 3B, in the first active region 300A, a first source/drain electrode 333a and a second source/drain electrode 333b are symmetrical with respect to the gate electrode 321 while overlapping partially with the gate electrode 321. In the first active region 300A, an active layer 325 includes a first source/drain region 325a under the first source/drain electrode 333a, a second source/drain region 325b under the second source/drain electrode 333b, and a first channel region 325ch_1 between the first and second source/drain regions 325a and 325b.

As illustrated in FIG. 3C, in the second active region 300B, a third source/drain electrode 333c overlaps partially with the gate electrode 321, and a fourth source/drain electrode 333d is separated from the gate electrode 321 by a distance $d_3$. In the second active region 300B, the active layer 325 includes a third source/drain region 325c under the third source/drain electrode 333c, a fourth source/drain region 325d under the fourth source/drain electrode 333d, and a second channel region 325ch_2 between the third and fourth source/drain regions 325c and 325d. The second channel region 325ch_2 includes an offset region (corresponding to that portion of the second channel region 325ch_2 marked off by the distance $d_3$ in FIG. 3C, as well as to the area between the gate electrode 321 and the fourth source/drain electrode 333d marked off by the distance $d_3$ in FIG. 3A) between the gate electrode 321 and the fourth source/drain electrode 333d.

As illustrated in FIG. 3D, in the third active region 300C, a fifth source/drain electrode 333e is separated from the gate electrode 321 by the distance $d_3$, and a sixth source/drain electrode 333f overlaps partially with the gate electrode 321. In the third active region 300C, the active layer 325 includes a fifth source/drain region 325e under the fifth source/drain electrode 333e, a sixth source/drain region 325f under the sixth source/drain electrode 333f, and a third channel region 325ch_3 between the fifth and sixth source/drain regions 325e and 325f. The third channel region 325ch_3 includes an offset region (corresponding to that portion of the third channel region 325ch_3 marked off by the distance $d_3$ in FIG. 3D, as well as to the area between the gate electrode 321 and the fifth source/drain electrode 333e marked off by the distance $d_3$ in FIG. 3A) between the fifth source/drain electrode 333e and the gate electrode 321.

The layout of the third source/drain electrode 333c and the fourth source/drain electrode 333d in the second active region 300B is rotationally symmetrical to that of the fifth source/drain electrode 333e and the sixth source/drain electrode 333f in the third active region 300C.

As illustrated in FIG. 3A, in the fourth active region 300D, a seventh source/drain electrode 333g and an eighth source/drain electrode 333h are symmetrical with respect to the gate electrode 321 while overlapping partially with the gate electrode 321. The layout of the seventh source/drain electrode 333g and the eighth source/drain electrode 333h in the fourth active region 300D is substantially the same as that of the first source/drain electrode 333a and the second source/drain electrode 333b in the first active region 300A. Thus, similar to the structure of the first active region 300A shown in FIG. 3B, in the fourth active region 300D, the active layer 325 includes a seventh source/drain region 325g under the seventh source/drain electrode 333g, an eighth source/drain region 325h under the eighth source/drain electrode 333h, and a fourth channel region 325ch_4 between the seventh and eighth source/drain regions 325g and 325h.

The first source/drain electrode 333a in the first active region 300A, the third source/drain electrode 333c in the second active region 300B, the fifth source/drain electrode 333e in the third active region 300C, and the seventh source/drain electrode 333g in the fourth active region 300D are electrically connected to one another. Thus, the same voltage is applied from the same source to the first, third, fifth, and seventh source/drain electrodes 333a, 333c, 333e, and 333g. Likewise, the second source/drain electrode 333b in the first active region 300A, the fourth source/drain electrode 333d in the second active region 300B, the sixth source/drain electrode 333f in the third active region 300C, and the eighth source/drain electrode 333h in the fourth active region 300D are electrically connected to one another. Thus, the same voltage is applied from the same source to the second, fourth, sixth, and eighth source/drain electrodes 333b, 333d, 333f, and 333h.

In this case, in the first active region 300A and the fourth active region 300D, the source/drain regions 325a, 325b, 325g, and 325h overlap with both ends of the gate electrode 321, thereby greatly improving the "on" current characteristics. In the second active region 300B, the fourth source/drain electrode 333d is separated from the gate electrode 321 by the distance $d_3$ and thus, the second channel region 325ch_2 has the offset region corresponding to the area between the gate electrode 321 and the fourth source/drain electrode 333d marked off by the distance $d_3$ in FIGS. 3A and 3C. In the third active region 300C, the fifth source/drain electrode 333e is separated from the gate electrode 321 by the distance $d_3$ and thus, the third channel region 325ch_3 has the offset region corresponding to the area between the fifth source/drain electrode 333e and the gate electrode 321 marked off by the distance $d_3$ in FIGS. 3A and 3D. Thus, a high electric field may be prevented from being applied to the second channel region 325ch_2 and the third channel region 325ch_3 since each of the second active region 300B and the third active region 300C have an offset region. Accordingly, when the active region 300 is considered, it may be possible to prevent the performance of the TFT from degrading, thereby improving the "off" current characteristics.

As described above, the first active region 300A and the fourth active region 300D are substantially the same in their layout and are symmetrical along an axis of symmetry in the vertical direction (and along a horizontal axis of symmetry, as well as being rotationally symmetrical), and the layout of the second active region 300B is rotationally symmetrical to that of the third active region 300C. Thus, when a direction of the same voltage is changed, a direction of current changes, but the total amount of current flowing through the active region 300 is substantially the same. According to the layout of the first to fourth active region 300A to 300D, the total amount of current flowing through the active region 300 in the TFT according to the current embodiment may be the same when the same voltage is applied regardless of a direction in which the voltage is applied, thus improving the "off" current characteristics and the "on" current characteristics.

In another embodiment, the first to fourth active regions 300A to 300D may be insulated from one another so that each of them may not be influenced by current flowing through the others. Also, as described above, in another embodiment, the first source/drain electrode 333a, the third source/drain electrode 333c, the fifth source/drain electrode 333e, and the seventh source/drain electrode 333g may be connected to one another, and the second source/drain electrode 333b, the fourth source/drain electrode 333d, the sixth source/drain electrode 333f, and the eighth source/drain electrode 333h may be connected to one another within the active region 300 while the first to fourth active regions 300A to 300D are insulated from one another.

Figure 4A:
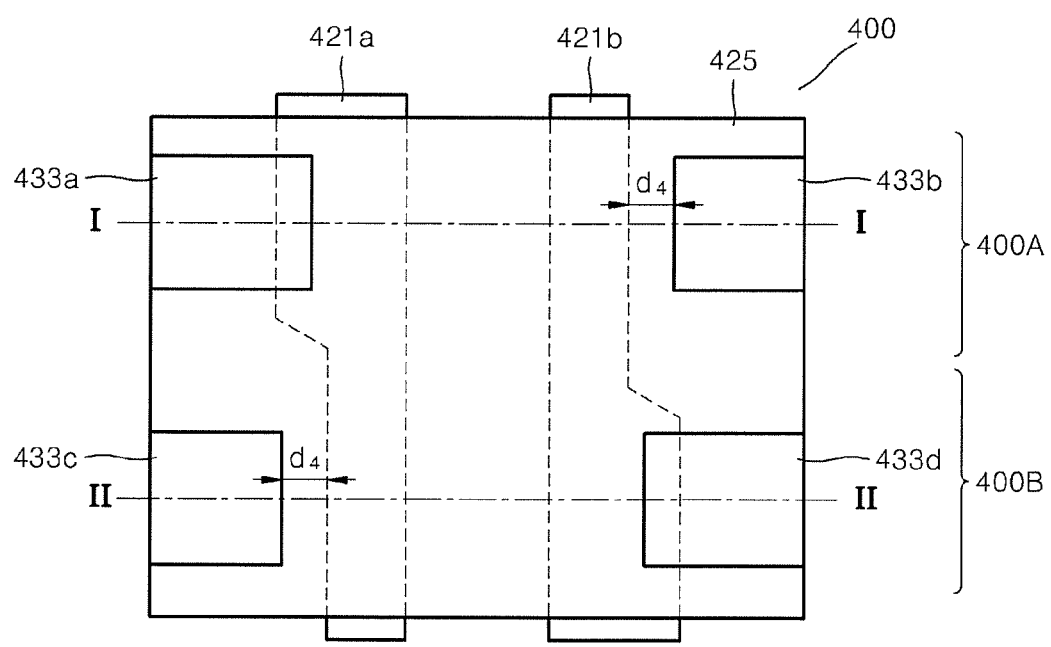
FIG. 4A is a layout diagram illustrating an active region for a TFT with an offset structure according to another embodiment of the present invention.
Figure 4B:
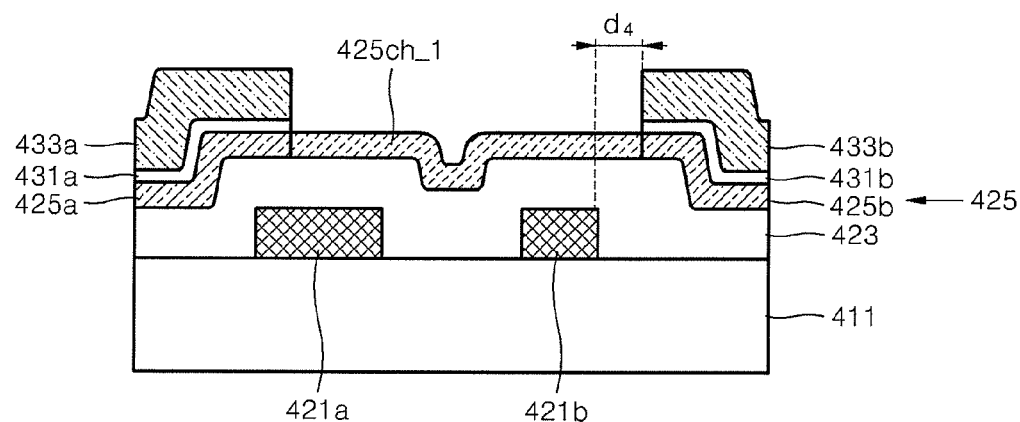
FIG. 4B is a cross-sectional view taken along a line I-I of FIG. 4A.
Figure 4C:
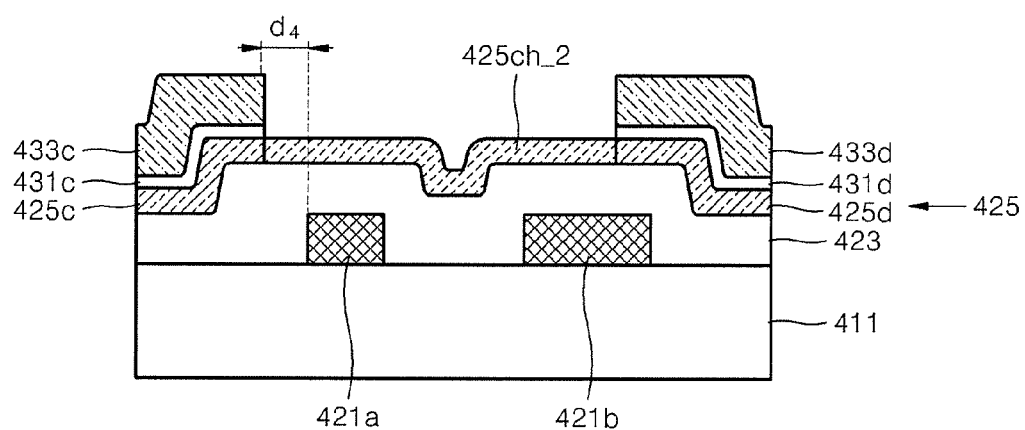
FIG. 4C is a cross-sectional view taken along a line II-II of FIG. 4A.

FIG. 4A is a layout diagram illustrating an active region 400 for a TFT with an offset structure according to another embodiment of the present invention. FIG. 4B is a cross-sectional view taken along a line I-I of FIG. 4A. FIG. 4C is a cross-sectional view taken along a line II-II of FIG. 4A. A vertical stacked structure of the TFT according to the current embodiment is similar to that of the TFT described above with reference to FIGS. 1A to 1C and thus, will not be described again here.

As illustrated in FIG. 4A, the active region 400 is divided into a first active region 400A and a second active region 400B that are rotationally symmetrical to each other. The TFT according to the current embodiment has a double gate structure, in which two gate electrodes, namely a first gate electrode 421a and a second gate electrode 421b, are included in parallel within one active region 400. The width of the portions of the first gate electrode 421a that overlap with the second active region 400B may be smaller than the width of the portions of the first gate electrode 421a that overlap with the first active region 400A, and the width of the portions of the second gate electrode 421b that overlap with the first active region 400A may be smaller than the width of the portions of the second gate electrode 421b that overlap with the second active region 400b (as illustrated with dashed lines in FIG. 4A).

As illustrated in FIG. 4B, in the first active region 400A, a first source/drain electrode 433a overlaps partially with the first gate electrode 421a, and a second source/drain electrode 433b is separated from the second gate electrode 421b by a distance $d_4$. Thus, an active layer 425 includes a first source/drain region 425a under the first source/drain electrode 433a, a second source/drain region 425b under the second source/drain electrode 433b, and a first channel region 425ch_1 between the first and second source/drain regions 425a and 425b. The first channel region 425ch_1 includes an offset region (corresponding to the area between the first gate electrode 421a and the second gate electrode 421b along the line I-I in FIG. 4A) between the first gate electrode 421a and the second gate electrode 421b, and an offset region (corresponding to that portion of the first channel region 425ch_1 marked off by the distance $d_4$ in FIG. 4B, as well as to the area between the second gate electrode 421b and the second source/drain electrode 433b marked off by the distance $d_4$ in FIG. 4A) between the second gate electrode 421b and the second source/drain electrode 433b.

As illustrated in FIG. 4C, in the second active region 400B, a third source/drain electrode 433c is separated from the first gate electrode 421a by the distance $d_4$, and a fourth source/drain electrode 433d overlaps partially with the second gate electrode 421b. Thus, the active layer 425 includes a third source/drain region 425c under the third source/drain electrode 433c, a fourth source/drain region 425d under the fourth source/drain electrode 433d, and a second channel region 425ch_2 between the third and fourth source/drain regions 425c and 425d. The second channel region 425ch_2 includes an offset region (corresponding to that portion of the second channel region 425ch_2 marked off by the distance $d_4$ in FIG. 4C, as well as to the area between the third source/drain electrode 433c and the first gate electrode 421a marked off by the distance $d_4$ in FIG. 4A) between the third source/drain electrode 433c and the first gate electrode 421a, and an offset region (corresponding to the area between the first gate electrode 421a and the second gate electrode 421b along the line II-II in FIG. 4A) between the first gate electrode 421a and the second gate electrode 421b.

The layout of the first source/drain electrode 433a and the second source/drain electrode 433b in the first active region 400A is rotationally symmetrical to that of the third source/drain electrode 433c and the fourth source/drain electrode 433d in the second active region 400B. The same rotational symmetry is also exhibited when the first gate electrode 421a and the second gate electrode 421b are considered, which accounts for the similar size in the offset regions and overlapping regions in the first action region 400A and the second active region 400B. In the active region 400, the first gate electrode 421a and the second gate electrode 421b are rotationally symmetrical to each other.

The first source/drain electrode 433a in the first active region 400A and the third source/drain electrode 433c in the second active region 400B are electrically connected to each other. Thus, the same voltage is applied from the same source to the first and third source/drain electrodes 433a and 433c. Likewise, the second source/drain electrode 433b in the first active region 400A and the fourth source/drain electrode 433d in the second active region 400B are electrically connected to each other. Thus, the same voltage is applied from the same source to the second and fourth source/drain electrodes 433b and 433d.

In the first active region 400A, if a high voltage is applied to the second source/drain electrode 433b, current flows from the first source/drain region 425a to the first channel region 425ch_1 and then to the second source/drain region 425b. In this case, the first and second gate electrodes 421a and 421b reduce the amount of "off" current, and the offset regions in the first channel region 425ch_1 prevent a high electric field from being applied to the first channel region 425ch_1. Thus, the performance of the TFT may be prevented from degrading, thereby improving the "off" current characteristics. In addition, the first source/drain region 425a overlaps with the first gate electrode 421a, thereby improving the "on" current characteristics.

If a direction in which the high voltage is applied is changed (for example, the high voltage is applied to the first source/drain electrode 433a in the first active region 400A), then current flows from the second source/drain region 425b to the first channel region 425ch_1 and then to the first source/drain region 425a. In this case, relative positions of the offset regions with respect to the first source/drain region 425a to which the high voltage is applied are different than when the high voltage is applied to the second source/drain electrode 433b. Thus, the intensity of an electric field formed in the first channel region 425ch_1 and the amounts of "on" current and "off" current are also different than when the high voltage is applied to the second source/drain electrode 433b.

That is, if only the first active region 400A is considered, the relative positions of the offset regions in the first channel region 425ch_1 with respect to the source/drain electrodes to which the high voltages are applied is different, when the voltage applied to the first source/drain electrode 433a and the voltage applied to the second source/drain electrode 433b are interchanged. As a result, the intensity of an electric field applied to the first channel region 425ch_1 is different when the high voltage is applied to the first source/drain electrode 433a than when the same voltage is applied to the second source/drain electrode 433b. Thus, the amount of current flowing through the first channel region 425ch_1 is not the same when the same voltage is applied to the first and second source/drain electrodes 433a and 433b, respectively. That is, the amount of current varies according to a direction in which the same voltage is applied. In addition, due to the rotational symmetry in the layouts of the first and second active regions 400A and 400B, the same phenomenon also takes place when only the second active region 400B is considered.

On the other hand, when the active region 400 including the first active region 400A and the second active region 400B is considered, the layout of the second active region 400B is rotationally symmetrical to that of the first active region 400A. Thus, if a high voltage is applied to the second source/drain electrode 433b in the first active region 400A, then the amount of current flowing through the first active region 400A is equal to (or substantially equal to) the amount of current flowing through the second active region 400B when the same high voltage is applied to the third source/drain electrode 433c in the second active region 400B. Likewise, if a high voltage is applied to the first source/drain electrode 433a in the first active region 400A, then the amount of current flowing through the first active region 400A is equal to (or substantially equal to) the amount of current flowing through the second active region 400B when the same high voltage is applied to the fourth source/drain electrode 433d in the second active region 400B.

Thus, the total amount of current flowing through the first and second active regions 400A and 400B when a high voltage is applied to the second source/drain electrode 433b in the first active region 400A and the fourth source/drain electrode 433d in the second active region 400B is substantially the same as when the same high voltage is applied to the first source/drain electrode 433a in the first active region 400A and the third source/drain electrode 433c in the second active region 400B. Thus, if a direction of the same voltage is changed, a direction of current changes, but the total amount of current flowing through the active region 400 remains substantially the same.

In other embodiments, the first and second active regions 400A and 400B may be insulated from each other so that each of them may not be influenced by current flowing through the other. In another embodiment, the first source/drain electrode 433a may be connected to the third source/drain electrode 433c and the second source/drain electrode 433b may be connected to the fourth source/drain electrode 433d within the active region 400 while the first and second active regions 400A and 400B are insulated from each other.

Figure 5A:
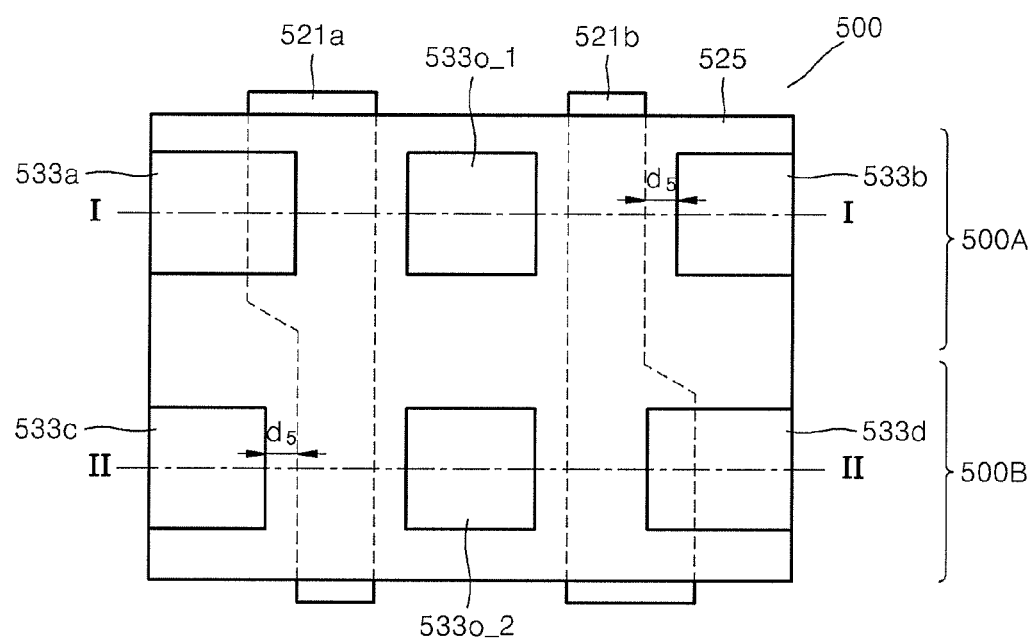
FIG. 5A is a layout diagram illustrating an active region for a TFT with an offset structure according to another embodiment of the present invention.
Figure 5B:
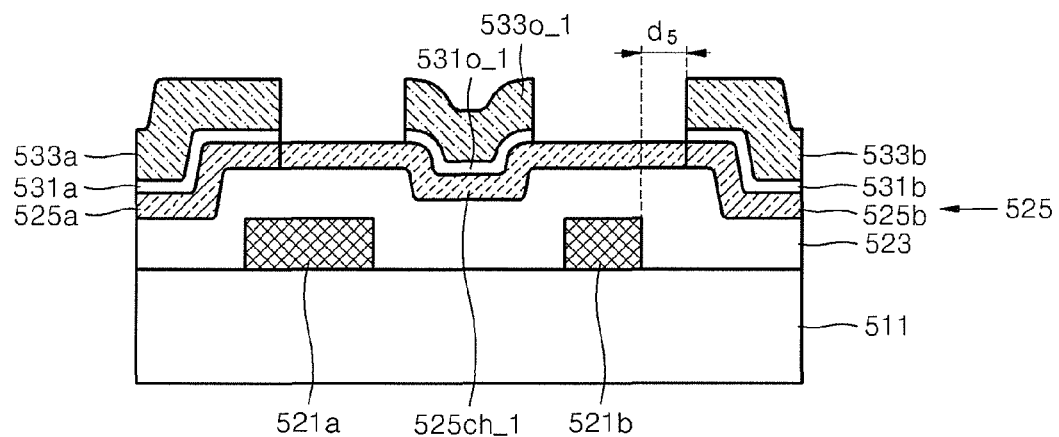
FIG. 5B is a cross-sectional view taken along a line I-I of FIG. 5A.
Figure 5C:
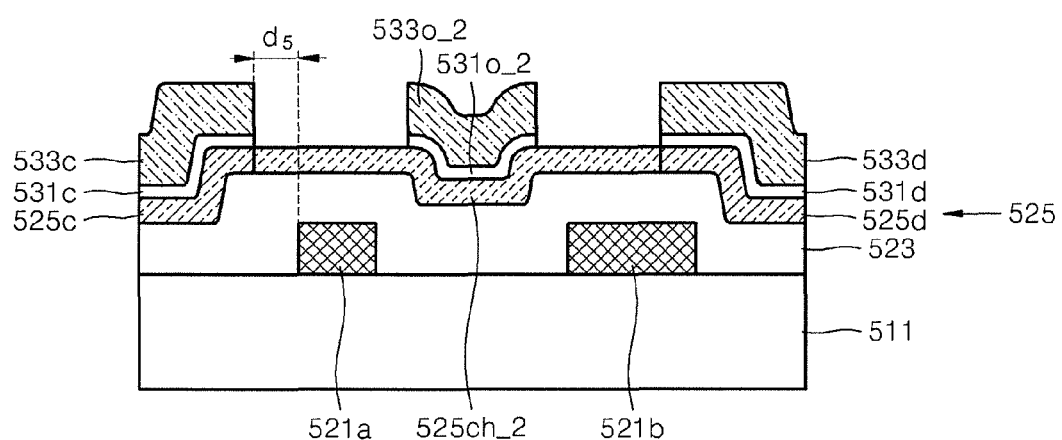
FIG. 5C is a cross-sectional view taken along a line II-II of FIG. 5A.

FIG. 5A is a layout diagram illustrating an active region 500 for a TFT with an offset structure according to another embodiment of the present invention. FIG. 5B is a cross-sectional view taken along a line I-I of FIG. 5A. FIG. 5C is a cross-sectional view taken along a line II-II of FIG. 5A. A vertical stacked structure of the TFT according to the current embodiment is similar to that of the TFT described above with reference to FIGS. 1A to 1C and thus, will not be described again here. The TFT according to the current embodiment is similar to the TFT of FIGS. 4A to 4C except that an offset electrode is formed between two gate electrodes, namely a first gate electrode 521a and a second gate electrode 521b. In some embodiments, like the one shown in FIG. 5A, the offset electrode includes two offset electrodes.

As illustrated in FIG. 5A, the active region 500 is divided into a first active region 500A and a second active region 500B that are rotationally symmetrical to each other. The TFT according to the current embodiment has a double gate structure, in which the first and second gate electrodes 521a and 521b are included in parallel within one active region 500. The width of the portions of the first gate electrode 521a that overlap with the second active region 500B may be smaller than the width of the portions of the first gate electrode 521a that overlap with the first active region 500A, and the width of the portions of the second gate electrode 521b that overlap with the first active region 500A may be smaller than the width of the portions of the second gate electrode 521b that overlap with the second active region 500b (as illustrated with dashed lines in FIG. 5A).

As illustrated in FIG. 5B, in the first active region 500A, a first source/drain electrode 533a overlaps partially with the first gate electrode 521a, and a second source/drain electrode 533b is separated from the second gate electrode 521b by a distance $d_5$. Thus, an active layer 525 includes a first source/drain region 525a under the first source/drain electrode 533a, a second source/drain region 525b under the second source/drain electrode 533b, and a first channel region 525ch_1 between the first and second source/drain regions 525a and 525b. The first channel region 525ch_1 includes an offset region (corresponding to the area between the first gate electrode 521a and the second gate electrode 521b along the line I-I in FIG. 5A, including the area corresponding to a first offset electrode 533o_1) between the first gate electrode 521a and the second gate electrode 521b, and an offset region (corresponding to that portion of the first channel region 525ch_1 marked off by the distance $d_5$ in FIG. 5B, as well as to the area between the second gate electrode 521b and the second source/drain electrode 533b marked off by the distance $d_5$ in FIG. 5A) between the second gate electrode 521b and the second source/drain electrode 533b.

The first offset electrode 533o_1 is located between the first gate electrode 521a and the second gate electrode 521b to be insulated from the active layer 525. The first offset electrode 533o_1 may be electrically connected to the first and second gate electrodes 521a and 521b. A first offset insulation layer 531o_1 is formed between the first channel region 525ch_1 and the first offset electrode 533o_1 to insulate the first offset electrode 533o_1 from the active layer 525.

As illustrated in FIG. 5C, in the second active region 500B, a third source/drain electrode 533c is separated from the first gate electrode 521a by the distance $d_5$, and a fourth source/drain electrode 533d overlaps partially with the second gate electrode 521b. In the second active region 500B, the active layer 525 includes a third source/drain region 525c under the third source/drain electrode 533a, a fourth source/drain region 525d under the fourth source/drain electrode 533b, and a second channel region 525ch_2 between the third and fourth source/drain regions 525c and 525d. The second channel region 525ch_2 includes an offset region (corresponding to that portion of the second channel region 525ch_2 marked off by the distance $d_5$ in FIG. 5C, as well as to the area between the third source/drain electrode 533c and the first gate electrode 521a marked off by the distance $d_5$ in FIG. 5A) between the third source/drain electrode 533c and the first gate electrode 521a, and an offset region (corresponding to the area between the first gate electrode 521a and the second gate electrode 521b along the line II-II in FIG. 5A, including the area corresponding to a second offset electrode 533o_2) between the first gate electrode 521a and the second gate electrode 521b.

The second offset electrode 533o_2 is located between the first gate electrode 521a and the second gate electrode 521b to be insulated from the active layer 525. The second offset electrode 533o_2 may be electrically connected to the first and second gate electrodes 521a and 521b. A second offset insulation layer 531o_2 is formed between the second channel region 525ch_2 and the second offset electrode 533o_2 to insulate the second offset electrode 533o_2 from the active layer 525.

The layout of the first source/drain electrode 533a and the second source/drain electrode 533b in the first active region 500A is rotationally symmetrical to that of the third source/drain electrode 533c and the fourth source/drain electrode 533d in the second active region 500B. The same rotational symmetry is also exhibited when the first gate electrode 521a and the second gate electrode 521b are considered, which accounts for the similar size in the offset regions and overlapping regions in the first action region 500A and the second active region 500B. In the active region 500, the first gate electrode 521a and the second gate electrode 521b are rotationally symmetrical to each other.

The first source/drain electrode 533a in the first active region 500A and the third source/drain electrode 533c in the second active region 500B are electrically connected to each other. Thus, the same voltage is applied from the same source to the first and third source/drain electrode 533a and 533c. Likewise, the second source/drain electrode 533b in the first active region 500A and the fourth source/drain electrode 533d in the second active region 500B are electrically connected to each other. Thus, the same voltage is applied from the same source to the second and fourth source/drain electrode 533b and 533d.

In the first active region 500A, if a high voltage is applied to the second source/drain electrode 533b, then current flows from the first source/drain region 525a to the first channel region 525ch_1 and then to the second source/drain region 525b. In this case, the first and second gate electrodes 521a and 521b reduce the amount of "off" current, and the offset regions in the first channel region 525ch_1 prevent a high electric field from being applied to the first channel region 525ch_1. In addition, the first offset electrode 533o_1 may control a resistance value of the offset region between the first gate electrode 521a and the second gate electrode 521b in such a manner that current may smoothly flow through the offset region. Therefore, the performance of the TFT may be prevented from degrading, thus improving the "off" current characteristics. Further, the first source/drain region 525a overlaps with the first gate electrode 521a, thus improving the "on" current characteristics.

If a direction in which the high voltage is applied is changed (for example, the high voltage is applied to the first source/drain electrode 533a in the first active region 500A), then current flows from the second source/drain region 525b to the first channel region 525ch_1 and then to the first source/drain region 525a. In this case, relative positions of the offset regions with respect to the first source/drain region 525a to which the high voltage is applied are different than when the high voltage is applied to the second source/drain electrode 533b. Thus, the intensity of an electric field formed in the first channel region 525ch_1 and the amounts of "on" current and "off" current are also different than when the high voltage is applied to the second source/drain electrode 533b.

That is, if only the first active region 500A is considered, the relative positions of the offset regions of the first channel region 525ch_1 with respect to the source/drain electrodes to which the high voltages are applied is different, when the voltage applied to the first source/drain electrode 533a and 533c and the voltage applied to the second source/drain electrode 533b are interchanged. As a result, the intensity of an electric field applied to the first channel region 525ch_1 is different when the high voltage is applied to the first source/drain electrode 533a than when the same voltage is applied to the second source/drain electrode 533b. Thus, the amount of current flowing through the first channel region 525ch_1 is not the same when the same voltage is applied to the first and second source/drain electrodes 533a and 533b, respectively. That is, the amount of current varies according to a direction in which the same voltage is applied. In addition, due to the rotational symmetry in the layouts of the first and second active regions 500A and 500B, the same phenomenon also takes place when only the second active region 500B is considered.

On the other hand, when the active region 500 including the first active region 500A and the second active region 500B is considered, the layout of the second active region 500B is rotationally symmetrical to that of the first active region 500A. Thus, if a high voltage is applied to the second source/drain electrode 533b in the first active region 500A, then the amount of current flowing through the first active region 500A is equal to (or substantially equal to) the amount of current flowing through the second active region 500B when the same high voltage is applied to the third source/drain electrode 533c in the second active region 500B. Likewise, if a high voltage is applied to the first source/drain electrode 533a in the first active region 500A, then the amount of current flowing through the first active region 500A is equal to (or substantially equal to) the amount of current flowing through the second active region 500B when the same high voltage is applied to the fourth source/drain electrode 533d in the second active region 500B.

Thus, the total amount of current flowing through the first and second active regions 500A and 500B when a high voltage is applied to the second source/drain electrode 533b in the first active region 500A and the fourth source/drain electrode 533d in the second active region 500B is substantially the same as when the same high voltage is applied to the first source/drain electrode 533a in the first active region 500A and the third source/drain electrode 533c in the second active region 500B. That is, if a direction of the same voltage is changed, a direction of current changes, but the total amount of current flowing through the active region 500 remains substantially the same.

In other embodiments, the first and second active regions 500A and 500B may be insulated from each other so that each of them may not be influenced by current flowing through the other. In another embodiment, the first source/drain electrode 533a may be connected to the third source/drain electrode 533c, the second source/drain electrode 533b may be connected to the fourth source/drain electrode 533d, and the first offset electrode 533o_1 may be connected to the second offset electrode 533o_2 within the active region 500 while the first and second active regions 500A and 500B are insulated from each other.

Figure 6A:
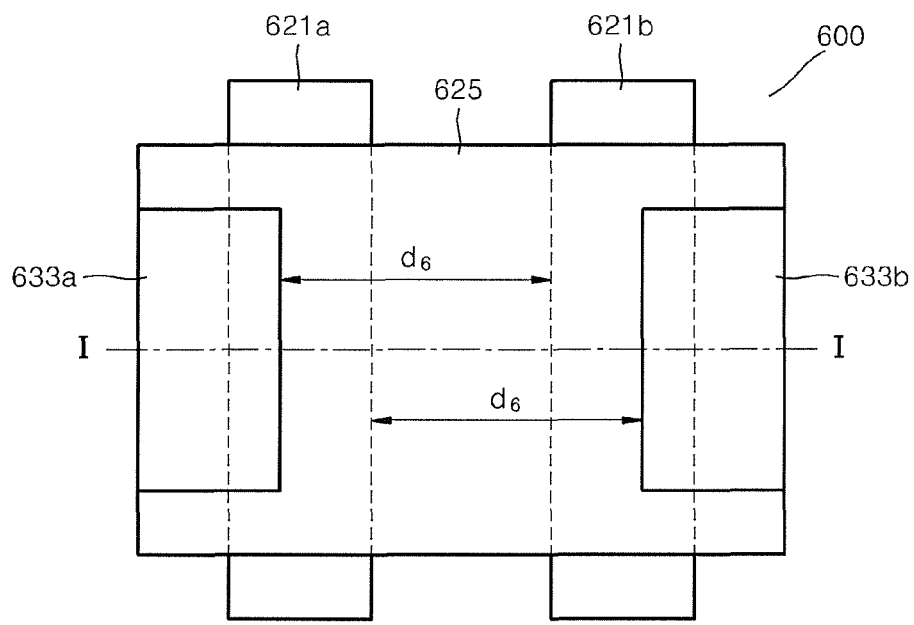
FIG. 6A is a layout diagram illustrating an active region for a TFT with an offset structure according to another embodiment of the present invention.
Figure 6B:
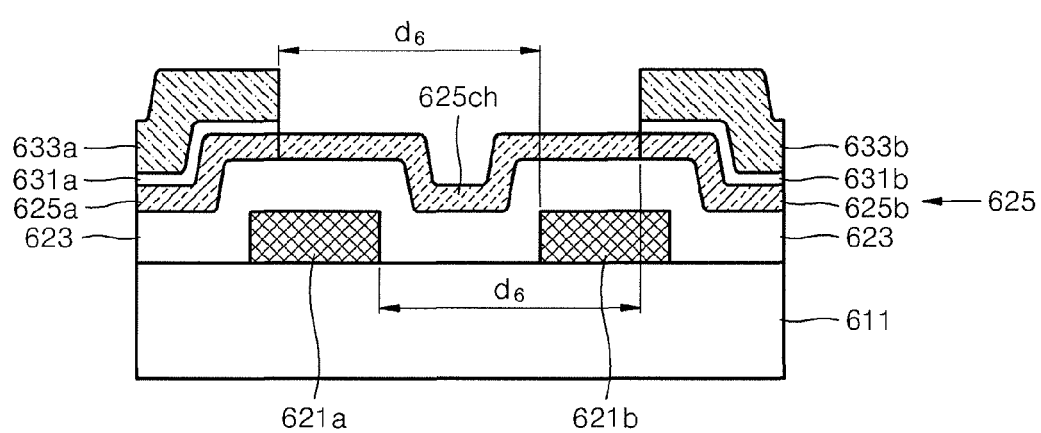
FIG. 6B is a cross-sectional view taken along a line I-I of FIG. 6A.

FIG. 6A is a layout diagram illustrating an active region 600 for a TFT with an offset structure according to another embodiment of the present invention. FIG. 6B is a cross-sectional view taken along a line I-I of FIG. 6A. A vertical stacked structure of the TFT according to the current embodiment is similar to that of the TFT described above with reference to FIGS. 1A to 1C and thus, will not be described again here. The TFT according to the current embodiment has a double gate structure, in which two gate electrodes, namely a first gate electrode 621a and a second gate electrode 621b, are included in parallel within one active region 600.

As illustrated in FIG. 6B, in the active region 600, a first source/drain electrode 633a overlaps partially with the first gate electrode 621a, and a second source/drain electrode 633b overlaps partially with the second gate electrode 621b. The first source/drain electrode 633a is separated from the second gate electrode 621b by a distance $d_6$ and thus, the first source/drain electrode 633a may be considered as being offset from the second gate electrode 621b. Likewise, the second source/drain electrode 633b is separated from the first gate electrode 621a by the distance $d_6$ and thus, the second source/drain electrode 633b may be considered as being offset from the first gate electrode 621a.

An active layer 625 includes a first source/drain region 625a under the first source/drain electrode 633a, a second source/drain region 625b under the second source/drain electrode 633b, and a channel region 625ch between the first and second source/drain regions 625a and 625b. The channel region 625ch includes an offset region (corresponding to the area between the first gate electrode 621a and the second gate electrode 621b along the line I-I in FIG. 6A, including the area corresponding to the intersection of the two regions marked off by the distance $d_6$) between the first gate electrode 621a and the second gate electrode 621b.

In the active region 600, the layout of the first source/drain electrode 633a is symmetrical to that of the second source/drain electrode 633b along a vertical axis of symmetry (for example, the line perpendicular to the line I-I and midway between the first gate electrode 621a and the second gate electrode 621b in FIG. 6A). In addition, the layout of the first gate electrode 621a is also symmetrical to that of the second gate electrode 621b along the same vertical axis of symmetry. The same symmetry for both the source/drain electrodes and the gate electrodes is also exhibited along a horizontal axis of symmetry (for example, the line I-I in FIG. 6A). Further, these sets of electrodes are also rotationally symmetrical.

In the active region 600, if a high voltage is applied to the second source/drain electrode 633b, then current flows from the first source/drain region 625a to the channel region 625ch and then to the second source/drain region 625b. In this case, the first and second gate electrodes 621a and 621b reduce the amount of "off" current, and the offset region of the channel region 625ch prevents a high electric field from being applied to the channel region 625ch. Therefore, the performance of the TFT may be prevented from degrading, thereby improving the "off" current characteristics. In addition, the first source/drain region 625a overlaps with the first gate electrode 621a, thus improving the "on" current characteristics. Similarly, the second source/drain region 625b overlaps with the second gate electrode 621b, thus improving the "on" current characteristics.

If a direction in which the high voltage is applied is changed (for example, the high voltage is applied to the first source/drain electrode 633a in the first active region 600), then current flows from the second source/drain region 625b to the channel region 625ch and then to the first source/drain region 625a. In this case, a relative position of the offset region with respect to the source/drain region 625a to which the high voltage is applied is the same as when the high voltage is applied to the second source/drain electrode 633b. Thus, current flowing through the active region 600 is different in terms of a direction thereof but is substantially the same in terms of the amount thereof, compared to when the high voltage is applied to the second source/drain electrode 633b. That is, the amount of current is substantially the same regardless of the direction in which the voltage is applied when the magnitude of the voltage is the same for each direction.

Figure 7A:
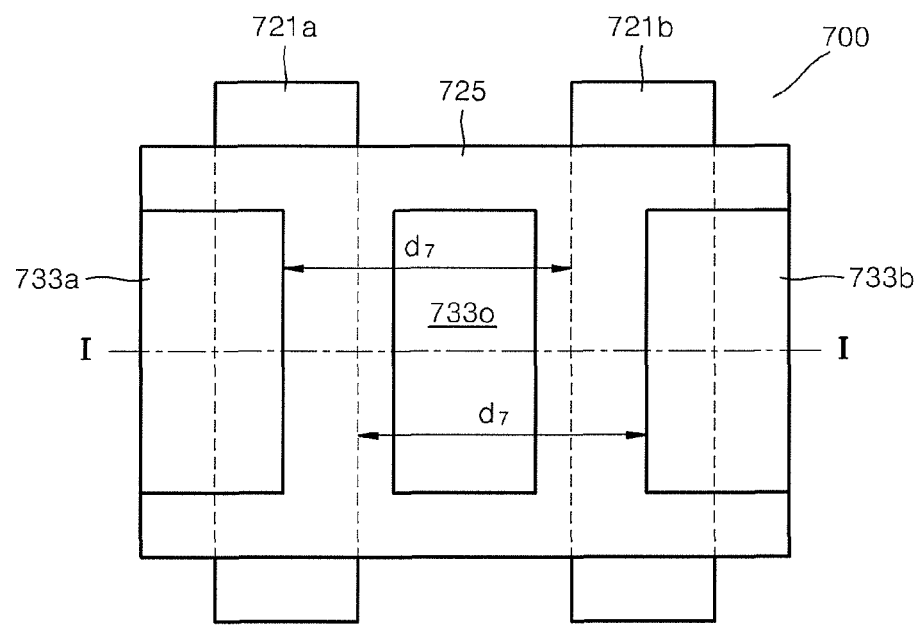
FIG. 7A is a layout diagram illustrating an active region for a TFT with an offset structure according to another embodiment of the present invention.
Figure 7B:
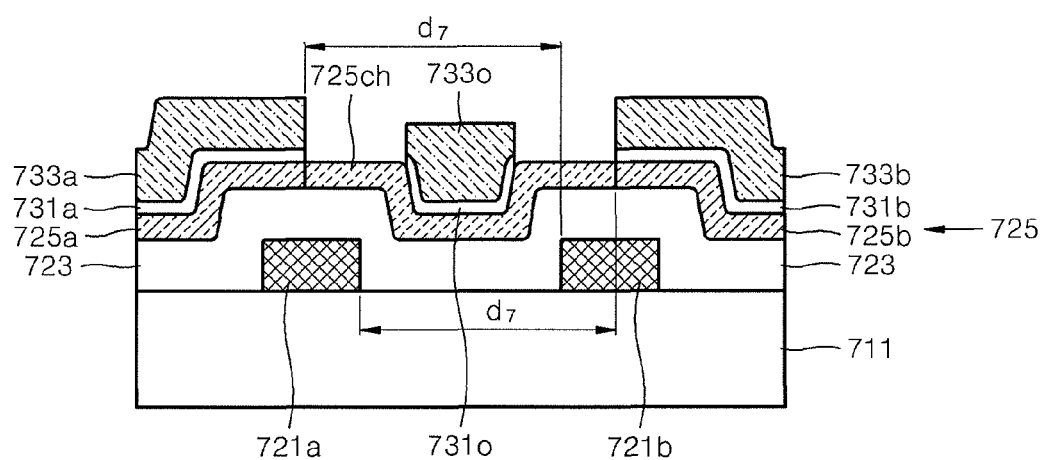
FIG. 7B is a cross-sectional view taken along a line I-I of FIG. 7A.

FIG. 7A is a layout diagram illustrating an active region 700 for a TFT with an offset structure according to another embodiment of the present invention. FIG. 7B is a cross-sectional view taken along a line I-I of FIG. 7A. A vertical stacked structure of the TFT according to the current embodiment is similar to the TFT described above with reference to FIGS. 1A to 1C and thus, will not be described again here. The TFT according to the current embodiment has a double gate structure, in which two gate electrodes, namely a first gate electrode 721*a* and a second gate electrode 721*b*, are included in parallel within one active region 700.

As illustrated in FIG. 7B, in the active region 700, a first source/drain electrode 733*a* overlaps partially with the first gate electrode 721*a*, and a second source/drain electrode 733*b* overlaps partially with the second gate electrode 721*b*. The first source/drain electrode 733*a* is separated from the second gate electrode 721*b* by a distance $d_7$ and thus, the first source/drain electrode 733*a* may be considered as being offset from the second gate electrode 721*b*. Likewise, the second source/drain electrode 733*b* is separated from the first gate electrode 721*a* by the distance $d_7$ and thus, the second source/drain electrode 733*b* may be considered as being offset from the first gate electrode 721*a*.

An active layer 725 includes a first source/drain region 725*a* under the first source/drain electrode 733*a*, a second source/drain region 725*b* under the second source/drain electrode 733*b*, and a channel region 725*ch* between the first and second source/drain regions 725*a* and 725*b*. The channel region 725*ch* includes an offset region (corresponding to the area between the first gate electrode 721*a* and the second gate electrode 721*b* along the line I-I in FIG. 7A, including the area corresponding to an offset electrode 733*o*) between the first gate electrode 721*a* and the second gate electrode 721*b*.

The offset electrode 733*o* is located between the first gate electrode 721*a* and the second gate electrode 721*b* to be insulated from the active layer 725. The offset electrode 733*o* may be electrically connected to the first and second gate electrodes 721*a* and 721*b*. An offset insulation layer 731*o* is formed between the channel region 725*ch* and the offset electrode 733*o* to insulate the offset electrode 733*o* from the active layer 725.

In the active region 700, the layout of the first source/drain electrode 733*a* is symmetrical to that of the second source/drain electrode 733*b* along a vertical axis of symmetry (for example, the line perpendicular to the line I-I and bisecting the offset electrode 733*o* in FIG. 7A). In addition, the layout of the first gate electrode 721*a* is also symmetrical to that of the second gate electrode 721*b* along the same vertical axis of symmetry. The same symmetry between these sets of electrodes is exhibited along a horizontal axis of symmetry (e.g., line I-I of FIG. 7A), and there is also rotational symmetry between these sets of electrodes.

In the active region 700, if a high voltage is applied to the second source/drain electrode 733*b*, then current flows from the first source/drain region 725*a* to the channel region 725*ch* and then to the second source/drain region 725*b*. In this case, the first and second gate electrodes 721*a* and 721*b* reduce the amount of "off" current, and the offset region in the channel region 725*ch* prevents a high electric field from being applied to the channel region 725*ch*. Accordingly, the performance of the TFT may be prevented from being degraded, thereby improving the "off" current characteristics. In addition, the offset electrode 733*o* may control a resistance value of the offset region between the first gate electrode 721*a* and the second gate electrode 721*b* in such a manner that current may smoothly flow through the offset region. Further, the first source/drain region 725*a* overlaps with the first gate electrode 721*a* and the second source/drain region 725*b* overlaps with the second gate electrode 721*b*, thereby improving the "on" current characteristics.

If a direction in which the high voltage is changed (for example, the high voltage is applied to the first source/drain electrode 733*a* in the active region 700), then current flows from the second source/drain region 725*b* to the channel region 725*ch* and then to the first source/drain region 725*a*. In this case, a relative position of the offset region with respect to the source/drain region 725*a* to which the high voltage is applied, is the same as when the high voltage is applied to the second source/drain electrode 733*b*. Thus, current flowing through the active region 700 is different in terms of a direction thereof but is substantially the same in terms of the amount thereof, compared to when the high voltage is applied to the second source/drain electrode 733*b*. That is, the amount of current is substantially the same regardless of the direction in which the voltage is applied when the magnitude of the voltage is the same for each direction.

Figure 8:
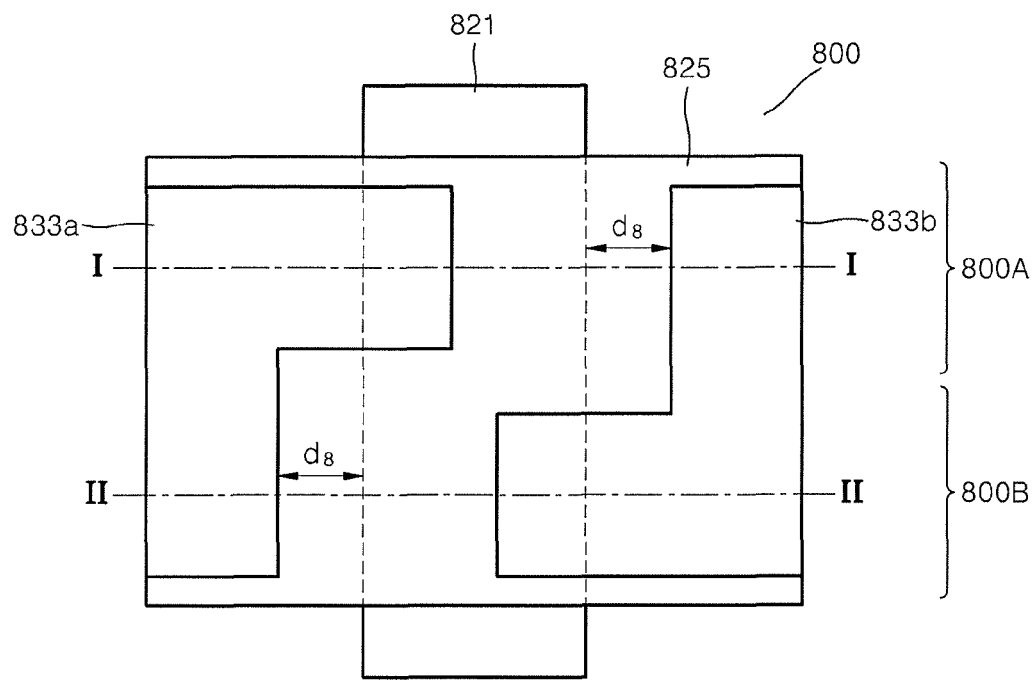
FIG. 8 is a layout diagram illustrating an active region for a TFT with an offset structure according to another embodiment of the present invention.

FIG. 8 is a layout diagram illustrating an active region 800 for a TFT with an offset structure according to another embodiment of the present invention. The active region 800 is divided into a first active region 800A and a second active region 800B that are rotationally symmetrical to each other.

Referring to FIG. 8, the active region 800 has the same structure as the active region 100 of FIG. 1A, except that a first source/drain electrode 833*a* is a combination of the first source/drain electrode 133*a* and the third source/drain electrode 133*c* of the active region 100 illustrated in FIG. 1A, and a second source/drain electrode 833*b* is a combination of the second source/drain electrode 133*b* and the fourth source/drain electrode 133*d* of the active region 100. Thus, a cross-sectional view of the TFT of FIG. 8 taken along a line I-I of FIG. 8 is the same as the cross-sectional view of FIG. 1B, and a cross-sectional view of the TFT of FIG. 8 taken along a line II-II of FIG. 8 is the same as the cross-sectional view of FIG. 1C.

In the first active region 800A, the first source/drain electrode 833*a* overlaps partially with a gate electrode 821 and the second source/drain electrode 833*b* is separated from the gate electrode 821 by a distance $d_8$. In the second active region 800B, the first source/drain electrode 833*a* is separated from the gate electrode 821 by the distance $d_8$, and the second source/drain electrode 833*b* overlaps partially with the gate electrode 821.

As described above with respect to the active region 100 of FIGS. 1A to 1C, in the TFT of FIG. 8, a high electric field may be prevented from being applied to a channel region due to an offset region between the gate electrode 821 and one of the source/drain electrodes, each of which is separated from the gate electrode 821 by the distance $d_8$. Thus, the performance of the TFT may be prevented from degrading, thus improving the "off" current characteristics. In addition, both the first source/drain electrode 833*a* and the second source/drain electrode 833*b* overlap partially with the gate electrode 821, thereby improving the "on" current characteristics. Since the first source/drain electrode 833*a*, the second source/drain electrode 833*b*, and the gate electrode 821 are rotationally symmetrical about the center of the active region 800, the amount of current flowing through a channel region is substantially the same regardless of a direction in which a voltage is applied to the first source/drain electrode 833*a* and the second source/drain electrode 833*b*, when the magnitude of the voltage is the same for each direction.

Although the first and second source/drain electrodes 833*a* and 833*b* are connected to each other in the first active region 800A and the second active region 800B, it is possible to limit a path of current by insulating an active layer 825.

Figure 9:
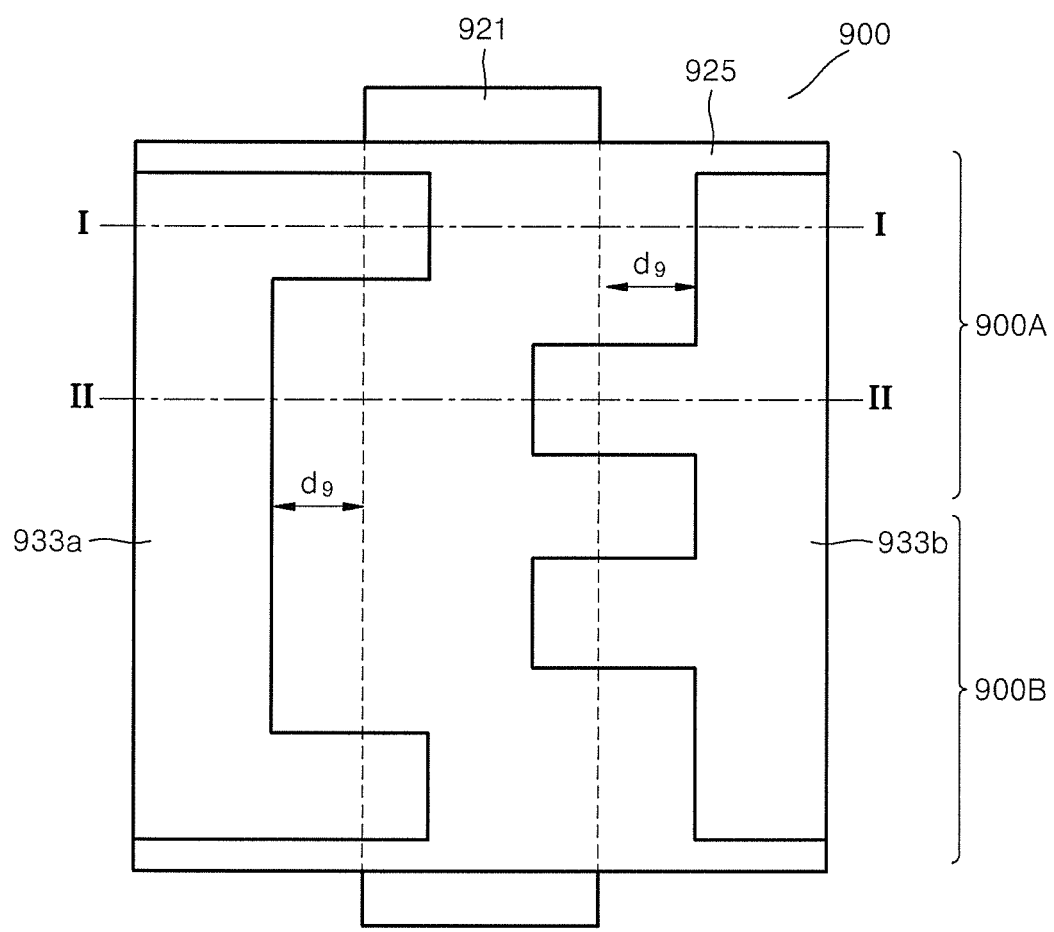
FIG. 9 is a layout diagram illustrating an active region for a TFT with an offset structure according to another embodiment of the present invention.

FIG. 9 is a layout diagram illustrating an active region 900 for a TFT with an offset structure according to another embodiment of the present invention. The active region 900 is divided into a first active region 900A and a second active region 900B that are symmetrical to each other along a horizontal axis of symmetry (for example, the line separating the first active region 900A and the second active region 900B).

The active region 900 is a combination of two active regions 800 of FIG. 8, with the layout of one active region 800 being the mirror image (reflection) of the layout of the other active region 800. Specifically, the active region 900 has a structure in which the two active regions 800 of FIG. 8 are separated from each other by a distance (for example, a predetermined distance) and symmetrical to each other along the horizontal axis of symmetry (for example, the line separating the first active region 900A and the second active region 900B). In addition, bottom and top surfaces of the first and second source/drain electrodes 833a and 833b of the active regions 800 are extended and joined together to form a first source/drain electrode 933a and a second source/drain electrode 933b. Thus, a cross-sectional view of the TFT of FIG. 9 taken along a line I-I of FIG. 9 is the same as the cross-sectional view of FIG. 1B and a cross-sectional view of the TFT of FIG. 9 taken along a line II-II of FIG. 9 is the same as the cross-sectional view of FIG. 1C.

In the first active region 900A, the first source/drain electrode 933a overlaps partially with a gate electrode 921 and a part of the first source/drain electrode 933a is offset from the gate electrode 921. In addition, a second source/drain electrode 933b overlaps partially with the gate electrode 921 and a part of the second source/drain electrode 933b is offset from the gate electrode 921.

As described above with respect to the active region 100 of FIGS. 1A to 1C, in the TFT of FIG. 9, a high electric field may be prevented from being applied to a channel region by using an offset region separated from the gate electrode 921 by a distance $d_9$. Thus, the performance of the TFT may be prevented from degrading, thus improving the "off" current characteristics. In addition, both the first source/drain electrode 933a and the second source/drain electrode 933b overlap partially with the gate electrode 921, thereby improving the "on" current characteristics. Since the first active region 900A and the second active region 900B are symmetrical to each other along the horizontal axis of symmetry, the amount of current flowing through a channel region is substantially the same regardless of whether a voltage is applied to the first source/drain electrode 933a or the second source/drain electrode 933b, when the magnitude of the voltage is the same for each direction.

Although the first and second source/drain electrodes 933a and 933b are connected in the first and second active regions 900A and 900B, it is possible to limit a path of current by insulating an active layer 925.

Various embodiments of a TFT with an offset structure according to the present invention have been described above, but the present invention is not limited to the above embodiments. Features of exemplary embodiments may include both an offset region and an overlapping region being present among the active regions of a cell, as well as electrodes that exhibit some form of symmetry with respect to each other, thereby improving both the "off" current characteristics and the "on" current characteristics.

Figure 10:
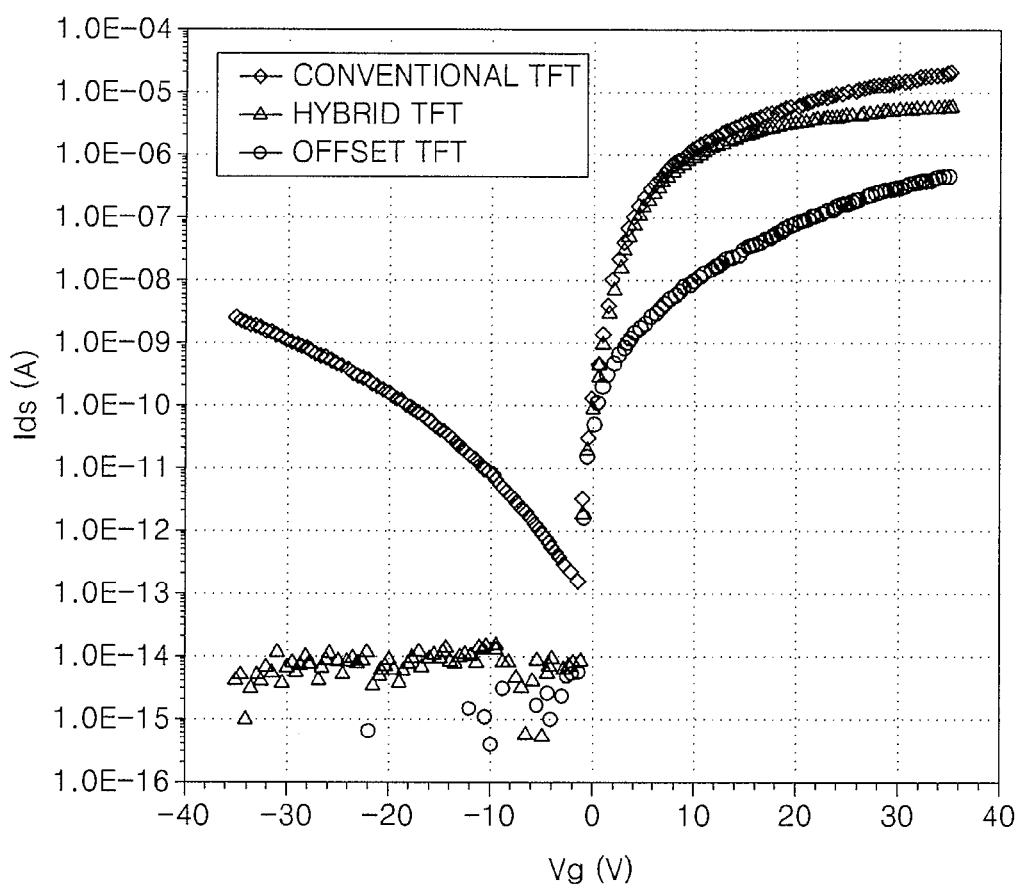
FIG. 10 is a graph illustrating results of a simulation in which the characteristics of a channel current versus a gate voltage of a TFT according to an embodiment of the present invention are compared with those of a comparative example.

FIG. 10 is a graph illustrating the results of a simulation in which the characteristics of a channel current $I_{ds}$ (vertical axis) versus a gate voltage $V_g$ (horizontal axis) in a TFT according to an embodiment of the present invention were compared with those of comparative examples. In the graph of FIG. 10, "Conventional TFT ◇" denotes a conventional TFT that does not have an offset structure, "Offset TFT○" denotes a conventional TFT with an offset structure, and "Hybrid TFT△" denotes a TFT with an offset structure, such as illustrated in FIGS. 1A to 1C, according to the present invention. Here, an ATLAS device simulation was used.

Referring to FIG. 10, a comparison of these three types of TFTs reveals that "Offset TFT○" shows the smallest amount of "off" current (e.g., corresponding to a negative gate voltage $V_g$) and also the smallest amount of "on" current (e.g., corresponding to a positive gate voltage $V_g$). In the conventional TFT "Offset TFT○" having an offset structure, the amount of "off" current is small due to an offset region, but the amount of "on" current is also small due to a high resistance value of the offset region. "Conventional TFT ◇" shows the largest amount of "on" current but also the largest amount of "off" current due to a leakage current. "Hybrid TFT△" shows that the amount of "on" current is as large as that depicted with "Conventional TFT ◇", but the amount of "off" current is as small as that depicted with "Offset TFT○". In the TFT hybrid TFT△ having an offset structure according to the present invention, it is concluded that the amount of "on" current is large due to an overlapping part of a source/drain electrode and a gate electrode and the amount of "off" current is small due to an offset region between the source/drain electrode and the gate electrode.

That is, it is noted from the graph of FIG. 10 that the amount of "off" current may be reduced while increasing the amount of "on" current, when a TFT having both an offset region and a non-offset region according to an embodiment of the present invention is used. Also, as described above, if source/drain electrodes and the gate electrode (or electrodes) are arranged to be symmetrical (for example, reflectional symmetry, rotational symmetry), the amount of current flowing through a channel region is substantially the same regardless of a direction in which a voltage is applied to a gate when the magnitude of the voltage is the same for each direction.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A thin film transistor (TFT) comprising an active region divided into a first active region and a second active region, the active region comprising:
   a gate electrode;
   an active layer comprising a first active layer corresponding to the first active region, and a second active layer corresponding to the second active region, the first active layer and the second active layer overlapping with the gate electrode;
   a gate insulating layer between the gate electrode and the active layer; and
   a source/drain electrode layer comprising a first source/drain electrode and a second source/drain electrode that are electrically connected to the first active layer, and a third source/drain electrode and a fourth source/drain electrode that are electrically connected to the second active layer,
   wherein:
      two source/drain electrodes selected from among the first to fourth source/drain electrodes overlap partially with the gate electrode,
      an other two source/drain electrodes from among the first to fourth source/drain electrodes are offset from the gate electrode, and
      the first to fourth source/drain electrodes and the gate electrode are in a symmetrical arrangement.

2. The TFT of claim 1, wherein:
the first and third source/drain electrodes are electrically connected to each other so that a same voltage is applied to the first and third source/drain electrodes, and
the second and fourth source/drain electrodes are electrically connected to each other so that a same voltage is applied to the second and fourth source/drain electrodes.

3. The TFT of claim 2 wherein:
the first source/drain electrode and the third source/drain electrode are connected to each other, and
the second source/drain electrode and the fourth source/drain electrode are connected to each other.

4. A TFT comprising two TFTs as claimed in claim 3, wherein corresponding source/drain and gate electrodes of the two TFTs are connected in a symmetrical arrangement to function as a single TFT.

5. The TFT of claim 1, wherein the active layer comprises a material selected from the group consisting of amorphous silicon, polycrystalline silicon, micro crystalline silicon, an oxide semiconductor, an organic semiconductor, and combinations thereof.

6. The TFT of claim 1, wherein the active region further comprises an ohmic contact layer between the active layer and the source/drain electrode layer.

7. The TFT of claim 1, wherein:
the first active layer comprises a first source/drain region corresponding to the first source/drain electrode, a second source/drain region corresponding to the second source/drain electrode, and a first channel region between the first source/drain region and the second source/drain region, and
the second active layer comprises a third source/drain region corresponding to the third source/drain electrode, a fourth source/drain region corresponding to the fourth source/drain electrode, and a second channel region between the third source/drain region and the fourth source/drain region.

8. The TFT of claim 7, wherein:
the first channel region comprises a first offset region that does not overlap with any of the gate electrode, the first source/drain electrode, and the second source/drain electrode, and
the second channel region comprises a second offset region that does not overlap with any of the gate electrode, the third source/drain electrode, and the fourth source/drain electrode.

9. The TFT of claim 1, wherein the source/drain electrode layer in the second active region is rotationally symmetrical to the source/drain electrode layer in the first active region.

10. The TFT of claim 9, wherein:
one of the first source/drain electrode and the second source/drain electrode overlaps with the gate electrode, and
an other of the first source/drain electrode and the second source/drain electrode is offset from the gate electrode.

11. The TFT of claim 1, wherein the first active region and the second active region are insulated from each other.

12. The TFT of claim 1, wherein the gate electrode comprises a first gate electrode and a second gate electrode that are parallel with each other.

13. The TFT of claim 12, wherein:
the first and third source/drain electrodes are electrically connected to each other so that a same voltage is applied to the first and third source/drain electrodes, and
the second and fourth source/drain electrodes are electrically connected to each other so that a same voltage is applied to the second and fourth source/drain electrodes.

14. The TFT of claim 12, wherein the source/drain electrode layer in the second active region is rotationally symmetrical to the source/drain electrode layer in the first active region.

15. The TFT of claim 14, wherein:
one of the first to fourth source/drain electrodes overlaps partially with the first gate electrode, and
an other of the first to fourth source/drain electrodes overlaps partially with the second gate electrode.

16. The TFT of claim 12, wherein a width of the first gate electrode that overlaps with the second active layer is smaller than a width of the first gate electrode that overlaps with the first active region.

17. The TFT of claim 12, wherein the active region further comprises an offset electrode overlapping with a region between the first gate electrode and the second gate electrode, the offset electrode being insulated from the active layer.

18. The TFT of claim 17, wherein the offset electrode comprises:
a first offset electrode overlapping with a region between the first and second source/drain electrodes, the first offset electrode being insulated from the first active layer; and
a second offset electrode overlapping with a region between the third and fourth source/drain electrodes, the second offset electrode being insulated from the second active layer.

19. The TFT of claim 17, wherein:
the first and third source/drain electrodes are electrically connected to each other so that a same voltage is applied to the first and third source/drain electrodes, and
the second and fourth source/drain electrodes are electrically connected to each other so that a same voltage is applied to the second and fourth source/drain electrodes.

20. The TFT of claim 17, wherein the offset electrode is electrically connected to the first gate electrode and the second gate electrode.

21. The TFT of claim 12, wherein the first active region and the second active region are insulated from each other.

22. A thin film transistor (TFT) comprising an active region divided into a first active region, a second active region, and a third active region, the active region comprising:
a gate electrode;
an active layer comprising a first active layer corresponding to the first active region, a second active layer corresponding to the second active region, and a third active layer corresponding to the third active region, the first active layer, the second active layer, and the third active layer overlapping with the gate electrode;
a gate insulating layer between the gate electrode and the active layer; and
a source/drain electrode layer comprising a first source/drain electrode and a second source/drain electrode that are electrically connected to the first active layer, a third source/drain electrode and a fourth source/drain electrode that are electrically connected to the second active layer, and a fifth source/drain electrode and a sixth source/drain electrode that are electrically connected to the third active layer,
wherein:
two source/drain electrodes selected from among the first to fourth source/drain electrodes overlap partially with the gate electrode,
other two source/drain electrodes from among the first to fourth source/drain electrodes are offset from the gate electrode, and the first to sixth source/drain electrodes and the gate electrode are in a symmetrical arrangement.

23. The TFT of claim 22, wherein:
the first, third, and fifth source/drain electrodes are electrically connected to each other so that a same voltage is applied to the first, third, and fifth source/drain electrodes, and
the second, fourth, and sixth source/drain electrodes are electrically connected to each other so that a same voltage is applied to the second, fourth, and sixth source/drain electrodes.

24. The TFT of claim 22, wherein the source/drain electrode layer in the third active region is symmetrical to the source/drain electrode layer in the first active region.

25. The TFT of claim 22, wherein:
the first source/drain electrode and the second source/drain electrode overlap partially with the gate electrode, and
the third source/drain electrode and the fourth source/drain electrode are offset from the gate electrode.

26. The TFT of claim 22, wherein:
the first active layer comprises a first source/drain region corresponding to the first source/drain electrode, a second source/drain region corresponding to the second source/drain electrode, and a first channel region between the first source/drain region and the second source/drain region,
the second active layer comprises a third source/drain region corresponding to the third source/drain electrode, a fourth source/drain region corresponding to the fourth source/drain electrode, and a second channel region between the third source/drain region and the fourth source/drain region, and
the third active layer comprises a fifth source/drain region corresponding to the fifth source/drain electrode, a sixth source/drain region corresponding to the sixth source/drain electrode, and a third channel region between the fifth source/drain region and the sixth source/drain region.

27. The TFT of claim 26, wherein the second channel region comprises an offset region that does not overlap with any of the gate electrode, the third source/drain electrode, and the fourth source/drain electrode.

28. The TFT of claim 27, wherein the source/drain electrode layer in the first active region, the source/drain electrode layer in the second active region, and the source/drain electrode layer in the third active region are symmetrical along an axis of symmetry.

29. The TFT of claim 22, wherein a width of the gate electrode that overlaps with the second active layer is smaller than a width of the gate electrode that overlaps with the first and third active regions.

30. The TFT of claim 22, wherein the first to third active regions are insulated from one another.

31. A thin film transistor (TFT) comprising an active region divided into a first active region, a second active region, a third active region, and a fourth active region, the active region comprising:
a gate electrode;
an active layer comprising a first active layer corresponding to the first active region, a second active layer corresponding to the second active region, a third active layer corresponding to the third active region, and a fourth active layer corresponding to the fourth active region, the first active layer, the second active layer, the third active layer, and the fourth active layer overlapping with the gate electrode;
a gate insulating layer between the gate electrode and the active layer; and
a source/drain electrode layer comprising a first source/drain electrode and a second source/drain electrode that are electrically connected to the first active layer, a third source/drain electrode and a fourth source/drain electrode that are electrically connected to the second active layer, a fifth source/drain electrode and a sixth source/drain electrode that are electrically connected to the third active layer, and a seventh source/drain electrode and an eighth source/drain electrode that are electrically connected to the fourth active layer,
wherein:
two source/drain electrodes selected from among the third to sixth source/drain electrodes overlap partially with the gate electrode,
other two source/drain electrodes from among the third to sixth source/drain electrodes are offset from the gate electrode, and
the first to eighth source/drain electrodes and the gate electrode are in a symmetrical arrangement.

32. The TFT of claim 31, wherein:
the first, third, fifth, and seventh source/drain electrodes are electrically connected to each other so that a same voltage is applied to the first, third, fifth, and seventh source/drain electrodes, and
the second, fourth, sixth, and eighth source/drain electrodes are electrically connected to each other so that a same voltage is applied to the second, fourth, sixth, and eighth source/drain electrodes.

33. The TFT of claim 31, wherein:
the first active layer comprises a first source/drain region corresponding to the first source/drain electrode, a second source/drain region corresponding to the second source/drain electrode, and a first channel region between the first source/drain region and the second source/drain region,
the second active layer comprises a third source/drain region corresponding to the third source/drain electrode, a fourth source/drain region corresponding to the fourth source/drain electrode, and a second channel region between the third source/drain region and the fourth source/drain region,
the third active layer comprises a fifth source/drain region corresponding to the fifth source/drain electrode, a sixth source/drain region corresponding to the sixth source/drain electrode, and a third channel region between the fifth source/drain region and the sixth source/drain region, and
the fourth active layer comprises a seventh source/drain region corresponding to the seventh source/drain electrode, an eighth source/drain region corresponding to the eighth source/drain electrode, and a fourth channel region between the seventh source/drain region and the eighth source/drain region.

34. The TFT of claim 33, wherein:
the second channel region comprises a first offset region that does not overlap with any of the gate electrode, the third source/drain electrode, and the fourth source/drain electrode, and
the third channel region comprises a second offset region that does not overlap with any of the gate electrode, the fifth source/drain electrode, and the sixth source/drain electrode.

35. The TFT of claim 34, wherein:
the source/drain electrode layer in the third active region is rotationally symmetrical to the source/drain electrode layer in the second active region, and
the source/drain electrode layer in the fourth active region is symmetrical to the source/drain electrode layer in the first active region.

36. The TFT of claim 35, wherein the first source/drain electrode and the second source/drain electrode overlap partially with the gate electrode.

37. The TFT of claim 35, wherein:
one of the third source/drain electrode and the fourth source/drain electrode overlaps with the gate electrode, and
an other of the third source/drain electrode and the fourth source/drain electrode is offset from the gate electrode.

38. The TFT of claim 31, wherein a width of the gate electrode that overlaps with the second and third active regions is smaller than a width of the gate electrode that overlaps with the first and fourth active regions.

39. The TFT of claim 31, wherein the first to fourth active regions are insulated from one another.

40. A thin film transistor (TFT) comprising an active region comprising:
a gate electrode comprising a first gate electrode and a second gate electrode that are parallel with each other;
an active layer overlapping with the first gate electrode and the second gate electrode, and comprising a first gate region corresponding to the first gate electrode, a second gate region corresponding to the second gate electrode, and an offset region extending from the first gate region to the second gate region;
a gate insulating layer between the gate electrode and the active layer; and
a source/drain electrode layer comprising a first source/drain electrode and a second source/drain electrode that are electrically connected to the active layer,
wherein:
the first source/drain electrode overlaps partially with the first gate electrode,
the second source/drain electrode overlaps partially with the second gate electrode,
the offset region does not overlap with any of the first gate electrode, the second gate electrode, the first source/drain electrode, and the second source/drain electrode, and
the first and second source/drain electrodes and the gate electrode are in a symmetrical arrangement.

41. The TFT of claim 40, wherein the active region further comprises an offset electrode overlapping with a region between the first gate electrode and the second gate electrode, the offset electrode being insulated from the active layer.

42. The TFT of claim 41, wherein the offset electrode is electrically connected to the first gate electrode and the second gate electrode.

43. The TFT of claim 40, wherein the active layer comprises a first source/drain region corresponding to the first source/drain electrode, a second source/drain region corresponding to the second source/drain electrode, and a channel region between the first source/drain region and the second source/drain region.

44. The TFT of claim 43, wherein the channel region comprises the offset region.

* * * * *